(12) United States Patent
Tang et al.

(10) Patent No.: US 8,671,326 B1
(45) Date of Patent: Mar. 11, 2014

(54) CONCATENATED CODES FOR RECOVERING STORED DATA

(75) Inventors: Xiangyu Tang, San Jose, CA (US); Yu Kou, San Jose, CA (US); Lingqi Zeng, Turlock, CA (US)

(73) Assignee: SK hynix memory solutions inc., San Jose, CA (US)

( * ) Notice: Subject to any disclaimer, the term of this patent is extended or adjusted under 35 U.S.C. 154(b) by 0 days.

(21) Appl. No.: 13/471,747

(22) Filed: May 15, 2012

Related U.S. Application Data

(60) Provisional application No. 61/486,706, filed on May 16, 2011, provisional application No. 61/563,492, filed on Nov. 23, 2011.

(51) Int. Cl.
*H03M 13/00* (2006.01)

(52) U.S. Cl.
USPC .......................................... 714/758; 714/800

(58) Field of Classification Search
USPC .................................... 714/758, 800
See application file for complete search history.

(56) References Cited

U.S. PATENT DOCUMENTS

| | | | |
|---|---|---|---|
| 6,606,718 B1 * | 8/2003 | Bessios ......................... | 714/701 |
| 7,065,701 B2 * | 6/2006 | Kim et al. ..................... | 714/795 |
| 7,383,484 B2 * | 6/2008 | Yeh et al. ...................... | 714/780 |
| 7,779,325 B2 * | 8/2010 | Song .............................. | 714/752 |
| 7,827,464 B2 * | 11/2010 | Kuznetsov et al. ........... | 714/755 |
| 7,849,388 B2 * | 12/2010 | Esumi et al. ................... | 714/800 |
| 7,925,959 B2 * | 4/2011 | Tan ................................ | 714/758 |
| 8,117,515 B2 * | 2/2012 | Yang ............................. | 714/755 |
| 8,140,950 B2 * | 3/2012 | Mantha et al. ................ | 714/800 |
| 8,205,147 B2 * | 6/2012 | Lin et al. ....................... | 714/804 |
| 8,255,765 B1 * | 8/2012 | Yeo et al. ....................... | 714/758 |
| 8,291,292 B1 * | 10/2012 | Varnica et al. ................ | 714/758 |
| 2008/0276156 A1 | 11/2008 | Gunnam et al. | |
| 2008/0301521 A1 | 12/2008 | Gunnam et al. | |

OTHER PUBLICATIONS

Peter Elias, Error-Free Coding, Department of Electrical Engineering and Research Laboratory of Electronics, Sep. 22, 1954.

Tang et al., A Novel Method for Combining Algebraic Decoding and Iterative Processing, ISIT, 2006, Seattle, USA.

Shiroishi et al., Future Options for HDD Storage, IEEE Transactions on Magnetics, 2009, vol. 45, No. 10.

* cited by examiner

*Primary Examiner* — James C Kerveros

(74) *Attorney, Agent, or Firm* — Van Pelt, Yi & James LLP

(57) ABSTRACT

A method of encoding user data into a first set of codewords using a first code, generating a first set of parity information based at least in part on the first set of codewords and at least a second code, and writing at least parity information associated with the first set of parity information to shingled magnetic recording storage. A method of performing decoding on a first set of read-back signal data read back from shingled magnetic recording storage and associated with a first set of codewords, and if decoding of at least one read-back signal in the first set of read-back signal data fails, performing decoding on at least some of a second set of read-back signal data associated with a set of parity information.

35 Claims, 17 Drawing Sheets

US 8,671,326 B1

CONCATENATED CODES FOR RECOVERING STORED DATA

CROSS REFERENCE TO OTHER APPLICATIONS

This application claims priority to U.S. Provisional Patent Application No. 61/486,706 entitled METHOD TO IMPROVE RELIABILITY OF DATA STORAGE SYSTEM filed May 16, 2011 which is incorporated herein by reference for all purposes; this application also claims priority to U.S. Provisional Patent Application No. 61/563,492 entitled NOVEL CONCATENATED CODES FOR REDUCING INTER-TRACK INTERFERENCE IN SHINGLE MAGNETIC RECORDING filed Nov. 23, 2011 which is incorporated herein by reference for all purposes.

BACKGROUND OF THE INVENTION

Data that is written to a storage medium may not be reliably recovered from the storage medium due to error introduced at the writing and/or reading processes. In shingled magnetic recording, this is a particular area of concern because tracks overlap and there will be more noise from the side track(s) compared to traditional magnetic storage systems. As such, error correction codes are used so that in the event that errors are found in the read-back signal, the data that was written to the medium may be recovered. New recovery techniques (e.g., triggered in the event a first level of error correction decoding fails) that could be used with shingled magnetic recording systems would be desirable. It would also be desirable if at least some of these recovery techniques required relatively little storage (e.g., the technique did not require much overhead information to be stored on the shingled magnetic storage system).

BRIEF DESCRIPTION OF THE DRAWINGS

Various embodiments of the invention are disclosed in the following detailed description and the accompanying drawings.

DETAILED DESCRIPTION

Figure 1:
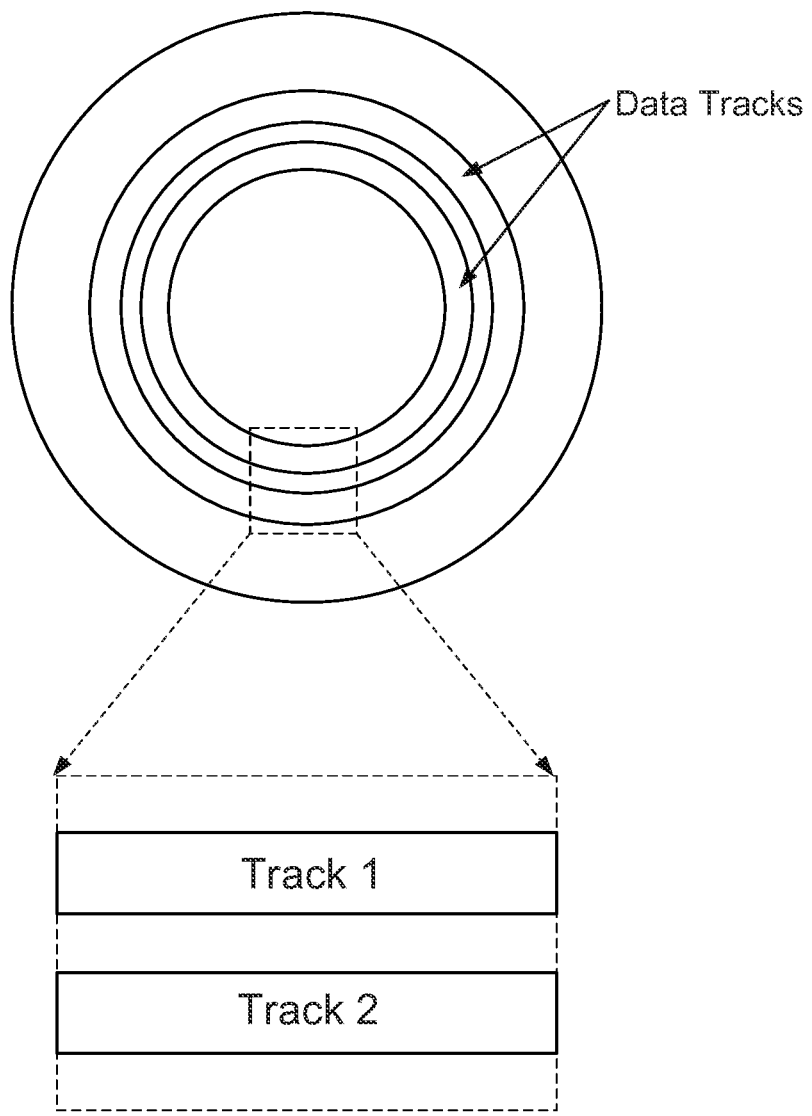
FIG. 1 is an example of how tracks are conventionally written on a HDD recording media.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Encoding and decoding concatenated codes are described herein. As used herein, "Scheme 1" refers to some embodiments in which two concatenated codes are used to encode user data into a set of codewords (e.g., generated using just the first code) and also a set of parity information (e.g., generated using the first and second codes), both of which are stored. In some embodiments of Scheme 1, the two concatenated codes and the parity information are used to decode the read-back signals in order to recover the original user data during a recovery mode (e.g., if there is a relatively large amount of noise, causing an initial decoding process to fail so that additional techniques or measures are needed to obtain the original user data). As used herein, "Scheme 2" refers to some embodiments in which three concatenated codes are used to encode user data into a set of codewords (e.g., generated using just the first code) and also a set of parity information (e.g., generated using the first, second, and third codes), both of which are stored. In some embodiments of Scheme 2, the three concatenated codes and the parity information are used to decode the read-back signals associated with the user data to recover the correct set of codewords during a recovery mode (e.g., in the event a first level of decoding or read processing has failed). In some embodiments, either or both of Scheme 1 and 2 may be applied in Shingled Magnetic Recording (SMR) to reduce the negative efforts of inter-track interference (ITI). However, either or both of Scheme 1 and 2 may be applied to other applications beside SMR.

Technologies proposed for next generation hard-disk drive (HDD) include SMR, bit-patterned magnetic recording (BPMR), heat assisted magnetic recording (HAMR), and microwave assisted magnetic recording (MAMR). In BPMR, bits are stored in small magnetic islands of around 10 nm, thus reducing interference among the bits. However, often, the bit-patterned medium needs to be manufactured in an advanced semiconductor-like process, requiring significant investment in manufacturing plant upgrade and expansion. In HAMR, a laser diode is used to heat the recording medium to assist the write process. In MAMR, a microwave oscillator is used to assist the write process. Both HAMR and MAMR require the incorporation of extra components to the write head and modification of the recording medium, which poses significant technical challenges and costs. On the other hand, for SMR, areal density is increased by writing overlapping tracks using relatively conventional head and media. Compared to BPMR, MAMR, and LAMR, SMR requires lower investments and poses fewer technical challenges, and is viewed as a strong candidate for next generation HDDs.

FIG. 1 is an example of how tracks are conventionally written on a HDD recording media. As shown in the example, the tracks are written concentrically, and adjacent tracks are not necessarily in contact with one another. However, in SMR, data tracks are written so closely together that they overlap.

Figure 2:
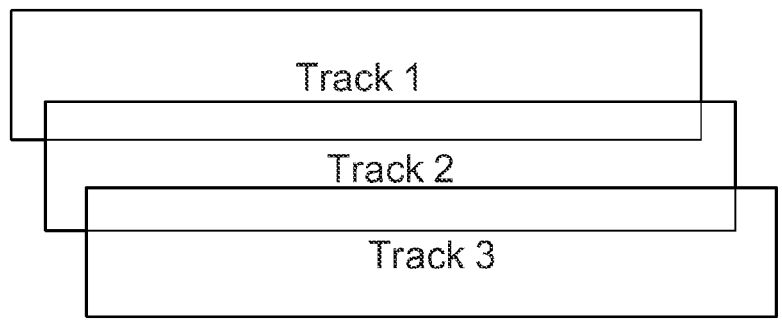
FIG. 2 is an example of how tracks are written in SMR.

FIG. 2 is an example of how tracks are written in SMR. In SMR, tracks are combined into groups, with a band-of-separation between the groups. Within each group, tracks are written sequentially in one direction cross-track. In contrast to the conventional scheme, SMR cannot support "update-in-place." That is, a single track cannot be rewritten because it will overwrite subsequent tracks. Due to track misregistration (TMR), the trajectory of write head and read head may not be perfectly circular and can cause read-back data tracks to be "warped."

Figure 3:
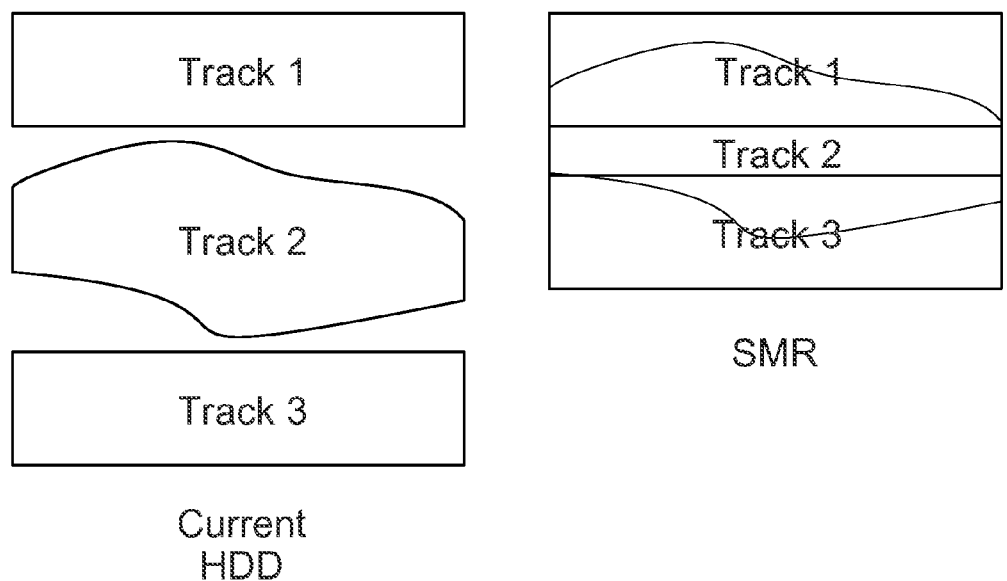
FIG. 3 is an example of a "warped" read-back data track.

FIG. 3 is an example of a "warped" read-back data track. As shown in the example, the "warped" track is Track 2. The TMR can either degrade the signal-to-noise ratio (SNR) of neighboring tracks or the current read track depending on whether the TMR occurred during the write or the read process, and this is referred to as ITI. ITI is especially pronounced in SMR because tracks overlap. As shown in FIG. 3, an off-track write section of Track 2 has significantly degraded a section of Track 1. Note that since Track 3 is written after Track 2, Track 3 is not degraded. Due to the mechanics of the servo arm, TMR has a time constant closely related to the time between two servo wedges. Consequently, data sectors that are affected by ITI either are consecutive or are closely spaced and experience a significant increase in bit errors. As will be described below, embodiments of Schemes 1 and 2 may be employed to address the ITI type of bit error problems experienced in SMR.

Figure 4:
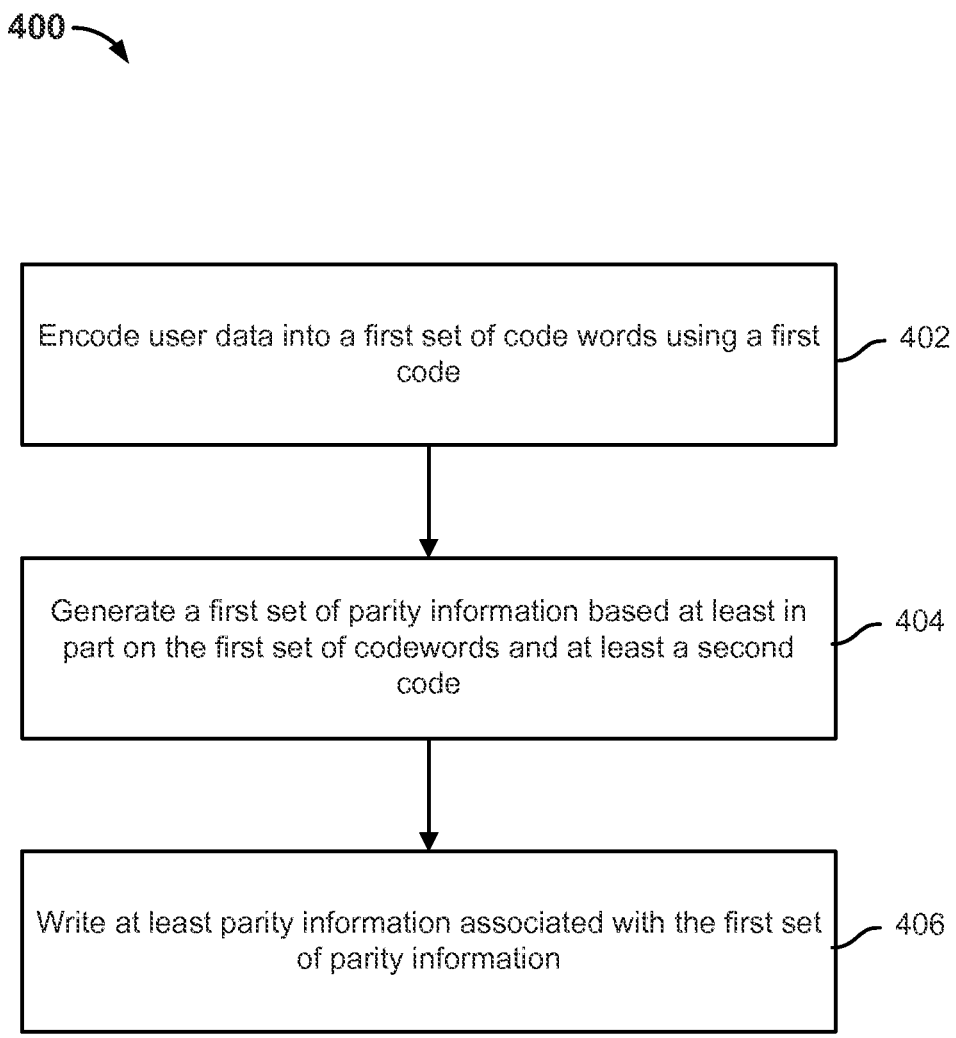
FIG. 4 is a flow diagram showing an embodiment of a process for encoding user data.

FIG. 4 is a flow diagram showing an embodiment of a process for encoding user data.

At 402, user data is encoded into a first set of codewords using a first code. In some embodiments, user data to be stored onto a medium (e.g., hard disk) is encoded using a first type of known coding scheme. The encoding will result in the first set of codewords, which will be written to the medium. In some embodiments, the first set of codewords may include at least some parity information generated by the first code.

At 404, a first set of parity information is generated based at least in part on the first set of codewords and at least a second code. In some embodiments, the second code comprises a systematic code. In some embodiments, at least a portion of the first set of codewords is used to generate a first set of parity information different than parity information that may have been generated by the first code (e.g., alone). The first code may comprise any appropriate code. In various embodiments, at least a portion of the first set of codewords is input to and encoded by the second systematic code and the parity information generated from the second systematic code comprises the first set of parity information.

At 406, at least parity information associated with the first set of parity information is written. In some embodiments, at least parity information is written with the first set of codewords (e.g., encoded from the user data) on the medium (e.g., hard disk).

As will be described further below, in various embodiments of Scheme 1, the at least parity information associated with the first set of parity information comprises the parity information generated from the second systematic code.

As will be described further below, in various embodiments of Scheme 2, the parity information generated from the second systematic code is grouped into one or more groups, and then each group is encoded using a third systematic code. In such embodiments of Scheme 2, the at least parity information associated with the first set of parity information comprises the parity information generated from the third systematic code.

In various embodiments of Scheme 1, two codes are used: code $C_1=\{n_1, k_1\}$ and $C_2=\{n_2, m\}$. $C_1$ may be any appropriate code and $C_2$ may be a systematic code. A systematic code is a code in which the input data is included in the encoded output. Sometimes, the encoded output of a systematic code includes the parity information concatenated to the input data. The input data that appears in the output data is referred to as the "information portion." In some embodiments, $C_2$ is a code with a relatively high code rate (put another way, the code is relatively efficient and does not generate much overhead or redundant information compared to the original user data). The proposed concatenated code under Scheme 1, C, is constructed by first encoding a set of m codewords from user data using a first code, where each of the set of m codewords is a member in $C_1$, $C_1=\{c_i \epsilon C_1 | i=0, \ldots, m-1\}$. In various embodiments, each piece of data to be encoded is also sometimes referred to as an "interleave." The corresponding bit in each m codewords encoded by the first code is then encoded using a second systematic code $C_2$ column-wise to produce $n_1$ codewords, $C_2=\{c_i \epsilon C_2 | i=0, \ldots, n_1-1\}$. At least in Scheme 1, the $C_1$ codewords and the $C_2$ codewords (both the systematic and parity portions thereof) are written to the medium (e.g., hard disk).

Figure 5:
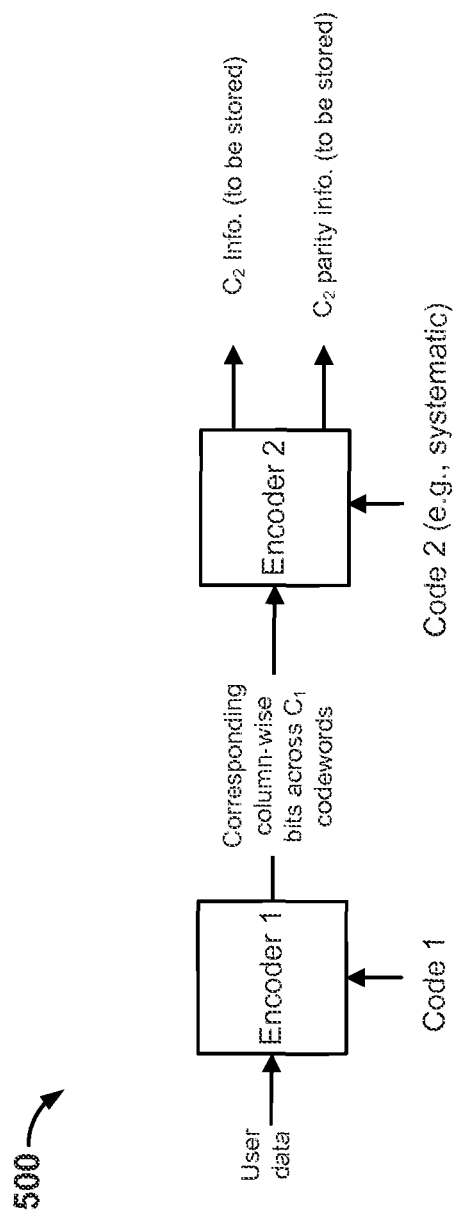
FIG. 5 is a diagram showing an embodiment of a system for encoding data using Scheme 1.

FIG. 5 is a diagram showing an embodiment of a system for encoding data using Scheme 1. System 500 includes two encoders: Encoder 1 (associated with Code 1) and Encoder 2 (associated with Code 2). User data is input into Encoder 1 to be encoded by Code 1, which is also input into Encoder 1. The output of Encoder 1 is $C_1$ codewords and a portion thereof is input into Encoder 2. In this example, the portion of the $C_1$ codewords that is input into Encoder 2 is the corresponding column-wise bits from each $C_1$ codeword. An example of this is described in further detail below. In some embodiments, there is a buffer and/or bit re-sequencer between Encoder 1 and Encoder 2 to resolve any differences between a desired or expected order that Encoder 2 is expecting bits to be input to it and the order in which Encoder 1 outputs bits. Code 2, which is a systematic code, is also input into Encoder 2 to be used to encode the corresponding column-wise bits from the $C_1$ codewords. So for example, to create a first $C_2$ codeword, the first bit from each $C_1$ codeword is used as input data, to create a second $C_2$ codeword, the second bit from each $C_1$ codeword is used as input data, and so forth. Because Code 2 is a systematic code, the $C_2$ codewords output from Encoder 2 include both an information portion (which is the input data as Code 2 is a systematic code) and also a parity information portion. For example, the $C_2$ parity information of a particular $C_2$ codeword may be generated by adding together all the $C_1$ input values for that particular $C_2$ codeword. The parity information of the $C_2$ codewords is stored onto the medium along with the $C_1$ codewords. Both the information portion and parity information of the $C_2$ codewords are stored along with the $C_1$ codewords.

Figure 6:
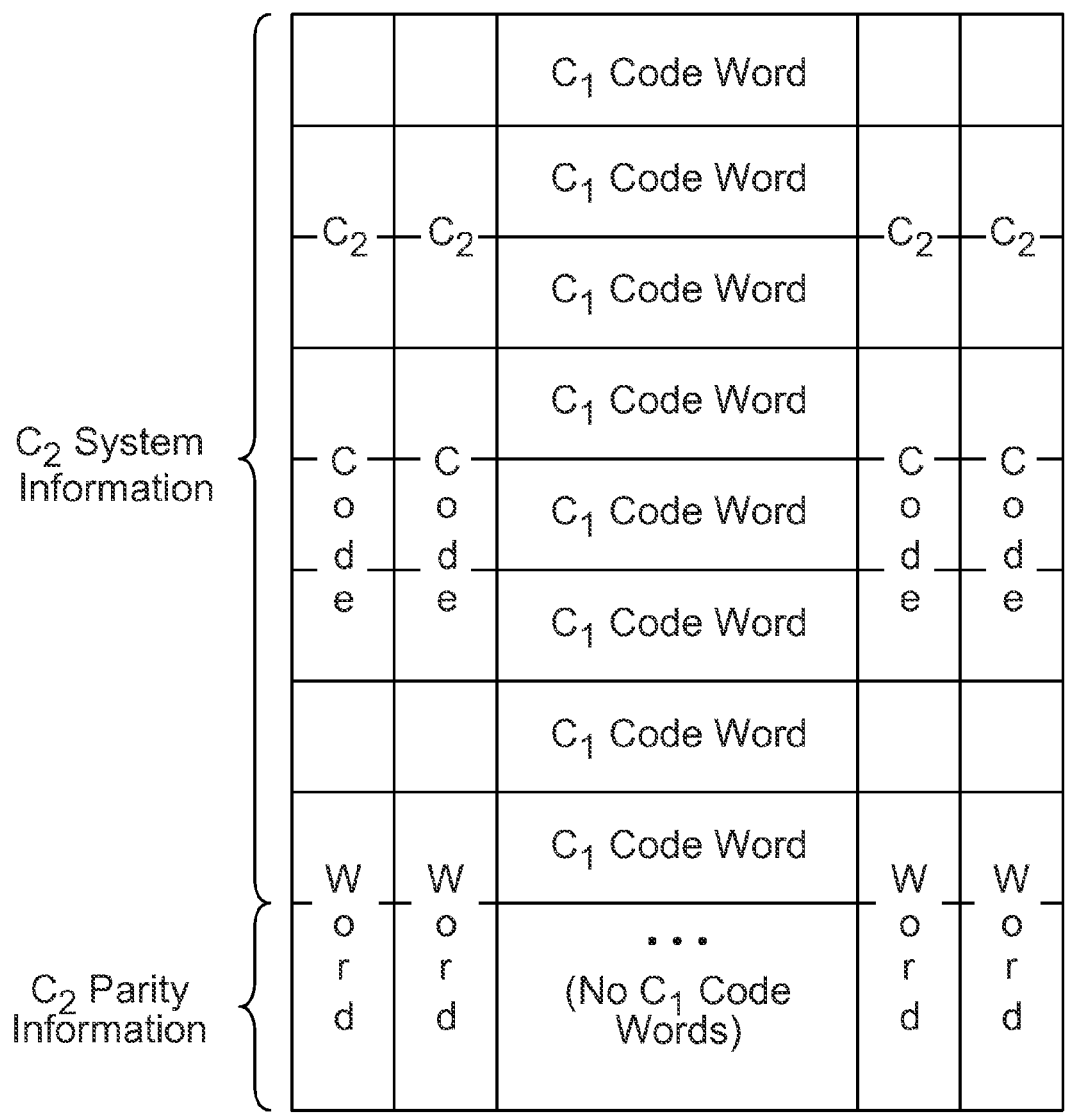
FIG. 6 is a diagram showing an embodiment of the encoded data of Scheme 1.

FIG. 6 is a diagram showing an embodiment of the encoded data of Scheme 1. The layout shown is to conceptually demonstrate the technique and may not necessarily reflect physical locations on the storage media itself. For example, rather than having the $C_1$ codewords arranged in different rows, some or all of the $C_1$ codewords may be in the same track on a magnetic storage disk. The encoded data in the example may be output by a system such as system 500. As shown in the example, codewords encoded from user data using the first code are labeled as $C_1$. Codewords encoded from the corresponding column-wise bit from each $C_1$ codeword using the second systematic code are labeled as $C_2$. In the example, the output of the second systematic code includes the input data (the information portion) appended with the generated parity information. As such, the information portion of the $C_2$ codewords is shown to be the corresponding column-wise bits from the $C_1$ codewords and the $C_2$ parity information is shown to be the portion that lies below the $C_1$ codewords. The $C_2$ parity information may comprise one or more bits (e.g., the "height" of the $C_2$ parity information in FIG. 6 may be one or more bits "high"). Both sets of $C_1$ codewords and $C_2$ codewords are stored such that during the decoding process, in the event that any of the $C_1$ codewords cannot be successfully decoded, one or more of the $C_2$ codewords may be used to recover the uncorrectable $C_1$ codewords.

In various embodiments of Scheme 2, three codes are used: $C_1=\{n_1, k_1\}$, $C_2=\{n_2, m\}$, and $C_3=\{n_3, k_3\}$, with $n_3-k_3>n_1-k_1$. In some embodiments, parameters $n_1, n_2, n_3, m, k_1$, and $k_3$ may be chosen as any values so long as $n_3-k_3>n_1-k_1$. $C_1$ may be implemented by any appropriate code, $C_2$ may be implemented using a systematic code (e.g., a high rate systematic code), and $C_3$ may be implemented using a systematic code. The proposed concatenated code, C, is constructed by first encoding a set of m codewords from user data using a first code, where each of the set of m codewords is a member in $C_1$, $C_1=\{c_i \epsilon C_1|i=0, \ldots, m-1\}$. The corresponding column-wise bit in each m codewords encoded by the first code is then encoded using the second systematic code in $C_2$ to produce $n_1$ codewords, $C_2=\{c_i \epsilon C_2|i=0, \ldots, n_1-1\}$. The parity bits in $C_2$ are then divided into $\lceil (n_2-m)n_1/k_3 \rceil$ groups, and each group of $\lceil (n_2-m)n_1/k_3 \rceil C_2$ parity bits is encoded by a third systematic code, $C_3$ into a codeword in $C_3=\{c_i \epsilon C_3|i=0, \ldots, \lceil (n_2-m)n_1/k_3 \rceil-1\}$ (where $\lceil \ \rceil$ is the ceiling function to round up to the next integer). If $k_3$ does not divide evenly into $(n_2-m)n_1$, then the necessary number of extra bits is padded to each $\lceil (n_2-m)n_1/k_3 \rceil$ group of $C_2$ parity bits. In some applications it may be preferable to select parameters such that $k_3$ divides evenly into $(n_2-m)n_1$. In this particular scheme, only the $C_1$ codewords and the parity portion of $C_3$ codewords are stored on the medium. A diagram of this is described in further detail below. The parity portion of $C_3$ codewords generally includes less data than the parity portion of the $C_2$ codewords, so by storing the parity portion of the $C_3$ codewords rather than the parity portion of the $C_2$ codewords (as is done for Scheme 1), Scheme 2 requires lower overhead information to actually be stored (e.g., on the magnetic storage media). The use of the parity portion of $C_3$ codewords in decoding also contributes to minimal memory usage during decoding. However, while Scheme 2 provides less overhead than Scheme 1, the decoding process for Scheme 2 may be more complex than that for Scheme 1.

Figure 7:
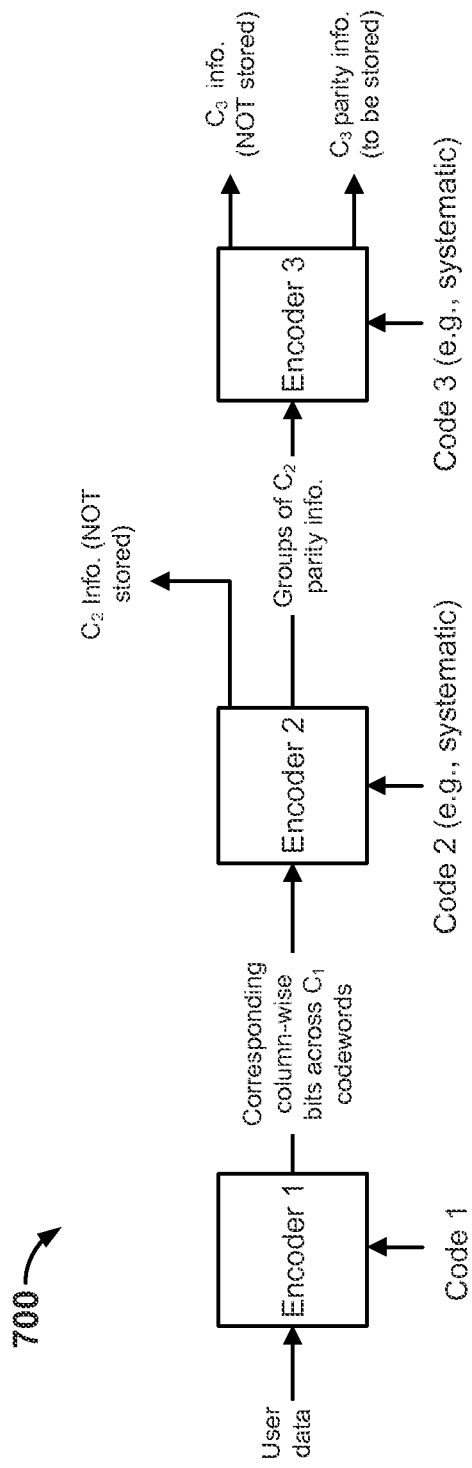
FIG. 7 is a diagram showing an embodiment of a system for encoding the data using Scheme 2.

FIG. 7 is a diagram showing an embodiment of a system for encoding the data using Scheme 2. System 700 includes three encoders: Encoder 1, Encoder 2, and Encoder 3. User data is input into Encoder 1 to be encoded using Code 1, which is also input into Encoder 1. The output of Encoder 1 is $C_1$ codewords which are input into Encoder 2. In this example, Encoder 2 operates on corresponding column-wise bits from each $C_1$ codeword. As described above, in some embodiments there is a buffer and/or bit re-sequencer between Encoder 1 and Encoder 2 to re-order bits as needed. Code 2, which is a systematic code, is also input into Encoder 2 to be used to encode the corresponding column-wise bits from each $C_1$ codeword. Because Code 2 is a systematic code, the $C_2$ codewords output from Encoder 2 include both an information portion (the input data) and also a parity information portion. In Scheme 2, the $C_2$ parity information is grouped (e.g., into $\lceil (n_2-m)n_1/k_3 \rceil$ number of groups) and input to Encoder 3. Code 3, which is a systematic code, is also input into Encoder 3 to be used to encode the groups of $C_2$ parity information. Because Code 3 is a systematic code, the $C_3$ codewords output from Encoder 3 include both an information portion (the input data) and also a parity information portion. In Scheme 2, only the $C_3$ parity information (and not the $C_3$ information portion) is stored on the medium along with the $C_1$ codewords.

Figure 8:
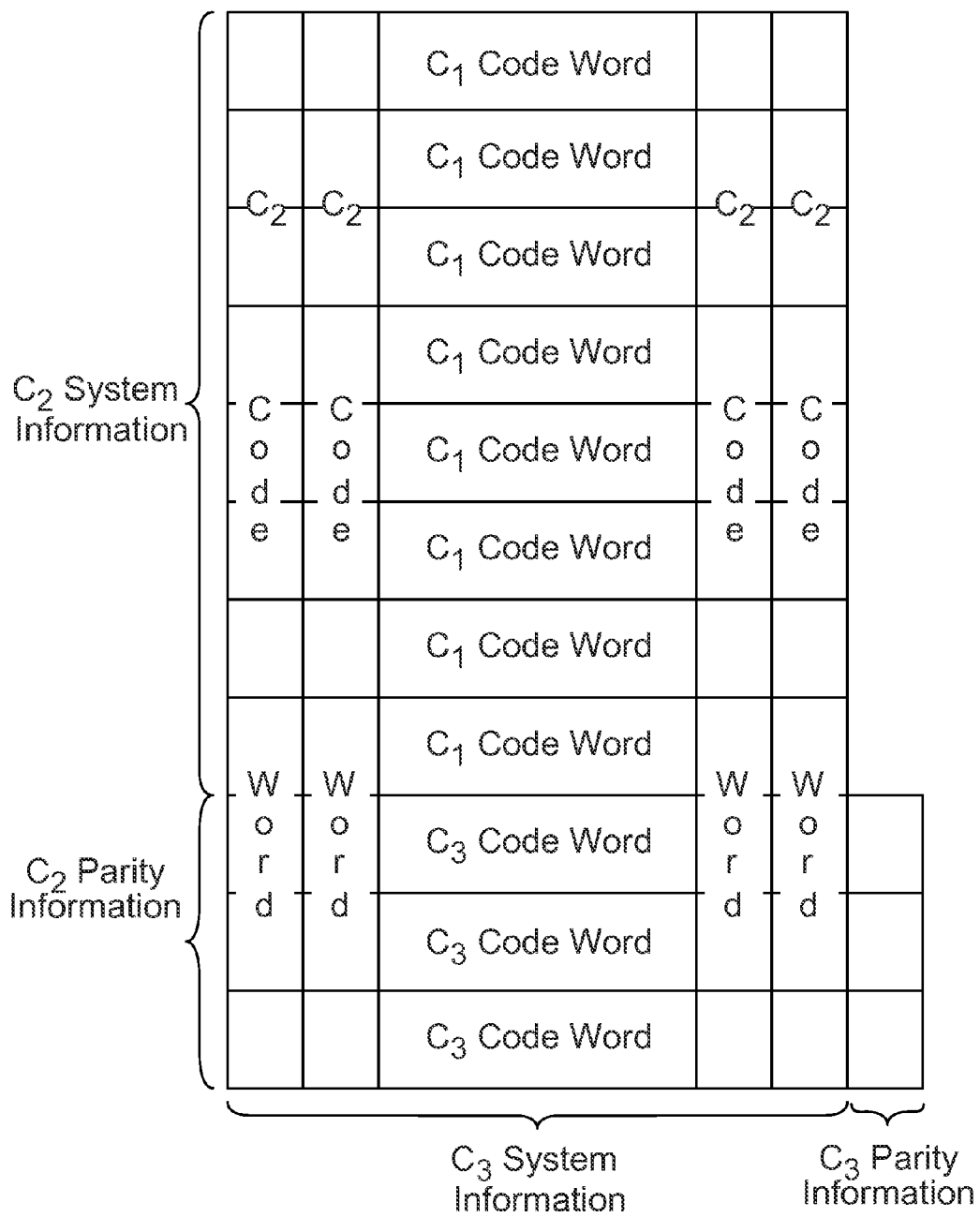
FIG. 8 is a diagram showing an embodiment of the encoded data of Scheme 2.

FIG. 8 is a diagram showing an embodiment of the encoded data of Scheme 2. The encoded data in the example may be output by a system such as system 700. As shown in the example, codewords encoded from user data using the first code are labeled as $C_1$ codewords. Codewords encoded from the corresponding column-wise bit from each $C_1$ codeword using the second systematic code are labeled as $C_2$ codewords. In the example, the output of the second systematic code includes the input data (the information portion) appended with the generated parity information. As such, the information portion of the $C_2$ codewords is shown to be the corresponding column-wise bits from the each $C_1$ codewords and the $C_2$ parity information is shown to be the portion that lies below the $C_1$ codewords. The $C_2$ parity information may comprise one or more bits per codeword (i.e., the "height" of the $C_2$ parity information may be 1 or more bits). The $C_2$ parity information is grouped (e.g., by rows) and codewords encoded from the groups using a third systematic code is labeled as $C_3$. In the example, the output of the third systematic code includes the input data (the information portion)

appended with the generated parity information. As such, the information portion of the $C_3$ codewords is shown to be the groups of $C_2$ parity information and the parity information of the $C_3$ codewords is shown to be the portion that extends to the right of the groups of $C_2$ parity information. The $C_3$ parity information may comprise one or more bits per $C_3$ codeword. The set of $C_1$ codewords and the parity information of the $C_3$ codewords (but not the $C_2$ parity information, which is the same thing as the $C_3$ information portion) are stored (e.g., on magnetic storage media) such that during the decoding process, in the event one or more of the $C_1$ codeword(s) cannot be successfully decoded (e.g., during a "normal" mode of decoding or reading), the $C_3$ parity information may be used to recover the uncorrectable $C_1$ codewords (e.g., during a recovery mode).

The following is an example of encoding data using Scheme 2: Let $C_1$ be a length 40000, rate 0.9 code, $C_1=\{40000,36000\}$. In FIG. 8, for example, the width of a $C_1$ codeword (which is the same width as $C_3$ system information) is 40,000 bits. Let m=100 in the concatenated code C. Let $C_2$ be a high-rate systematic block code, $C_2=\{104,100\}$. Let $C_3$ be a rate 0.8 code, $C_3=\{50000,40000\}$. After 100 interleaves have been encoded in $C_1$, $C_2$ is used to encode the corresponding column-wise bits in each column of $C_1$ codewords, generating 4 more interleaves of parity bits (e.g., the height of the $C_2$ parity information in FIG. 8 is 4 bits high). Each interleave of parity bits is then encoded again using code $C_3$, generating 4 codewords in $C_3$ with 10,000 parity bits. In FIG. 8, for example, the width of the $C_3$ system information is 40,000 bits and the width of the $C_3$ parity information is 10,000 bits. These 10,000 $C_3$ parity bits are stored, along with the original 100 interleaves (that is, the 100 $C_1$ codewords), on the HDD. The overhead is thus less than 1%.

The following is an example of a formal definition of the concatenated code of Scheme 2:

Given parameter m, code $C_1=\{n_1, k_1\}$, in this example a very high rate systematic code $C_2=\{n_2, m\}$, and a systematic code $C_3=\{n_3, k_3\}$ such that $n_3-k_3>n_1-k_1$, the concatenated code of Scheme 2 is associated with the following properties:

$$n = m \times n_1 + (n_3 - k_3)\left\lceil \frac{n_1(n_2 - m)}{k_3} \right\rceil, k = m \times k_1$$

There are a total of $$n = m + \left\lceil \frac{n_1(n_2 - m)}{k_3} \right\rceil (n_3 - k_3)/n_1$$

interleaves, the first m of which are codewords in $C_1$. The last $$\left\lceil \frac{n_1(n_2 - m)}{k_3} \right\rceil (n_3 - k_3)/n_1$$

interleaves are obtained by first encoding the bits in the first m interleaves column-wise using systematic code $C_2$. Then the constructed parity bits are further encoded by $C_3$, and the resultant parity bits in $C_3$ are used to form the interleaves. If $k_3$ does not divide into $n_1(n_2-m)$ evenly, then the necessary number of extra bits are padded.

Figure 9:
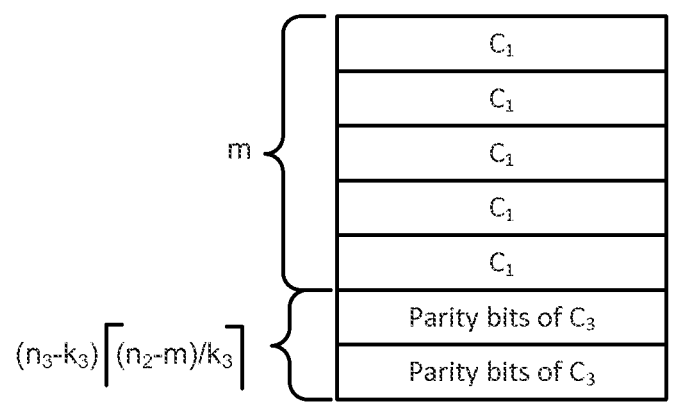
FIG. 9 is a diagram showing an embodiment of the data that is actually stored in the Scheme 2 encoding process.

FIG. 9 is a diagram showing an embodiment of the data that is actually stored in the Scheme 2 encoding process. As described above, the concatenated code generated with the encoding process of Scheme 2 results in the set of m $C_1$ codewords and the set of $$\left\lceil \frac{(n_2 - m)}{k_3} \right\rceil (n_3 - k_3) C_3$$

parity bits, which are stored on the medium (e.g., hard disk). The code is designed with $n_3-k_3>n_1-k_1$ so that if any of the first m interleaves cannot be successfully decoded in $C_1$, the redundant information from $C_3$ may be used to correct the errors. Lower overhead is achieved by only storing the parity part of $C_3$ (as opposed to also storing the $C_2$ parity portion, which is the same thing as the $C_3$ information portion) on the medium. As will be described further below, during decoding, only the uncorrectable $C_1$ codewords and the $n_2$-m $C_3$ codewords need to be stored in memory for post-processing (e.g., during a recovery process, if needed). This minimizes memory requirements during decoding.

Below are some examples of encoding using Scheme 1 and Scheme 2:

For Scheme 1, the m codewords in $C_1$ are encoded using a first code sequentially and at the same time, one or more instances of the encoder to encode in the second systematic code, $C_2$, operate to generate the $n_1(n_2-m)$-tuple parity. After m interleaves are encoded using the second systematic code, all the parity bits for $C_2$ are obtained as well.

Below is an example of a formal definition of the Scheme 1 encoding technique:
Initialize:
    reset systematic encoder(s) for $C_2$
    for i=0 to m−1
        encode user data interleave i in $C_1$
        update encoders for $C_2$ based on the newly encoded codeword in $C_1$
    end For Scheme 2, the m codewords in $C_1$ are encoded using a first code sequentially and at the same time, one or more instances of the encoder to encode in the second systematic code, $C_2$, operate to generate the $n_1(n_2-m)$-tuple parity. After m interleaves are encoded using the second systematic code, all the parity bits for $C_2$ are obtained as well. The $n_1(n_2-m)$ parity bits in $C_2$ are then divided into $\lceil (n_2-m)n_1/k_3 \rceil$ groups, and each group is encoded in $C_3$. If $k_3$ does not divide evenly into $n_1(n_2-m)$, $\lceil (n_2-m)n_1/k_3 \rceil - (n_2-m)n_1/k_3$ bits are padded. The $$(n_3 - k_3)\left\lceil \frac{n_1(n_2 - m)}{k_3} \right\rceil$$

parity bits of $C_3$ are stored on media.

Below is an example of a formal definition of the Scheme 2 encoding technique:
Initialize:
    reset systematic encoder(s) for $C_2$
    for i=0 to m−1
        encode user data interleave i in $C_1$
        update encoders for $C_2$ based on the newly encoded codeword in $C_1$
    end
    divide the parity bits of $C_2$ into $\lceil (n_2-m)n_1/k_3 \rceil$ groups, pad extra bits if needed
    encode each group in $C_3$. Send the encoded parity of $C_3$ to be stored on media Performance of the code depends heavily on the choice of $C_1$, $C_2$ and $C_3$, as well as the decoding technique.

Figure 10:
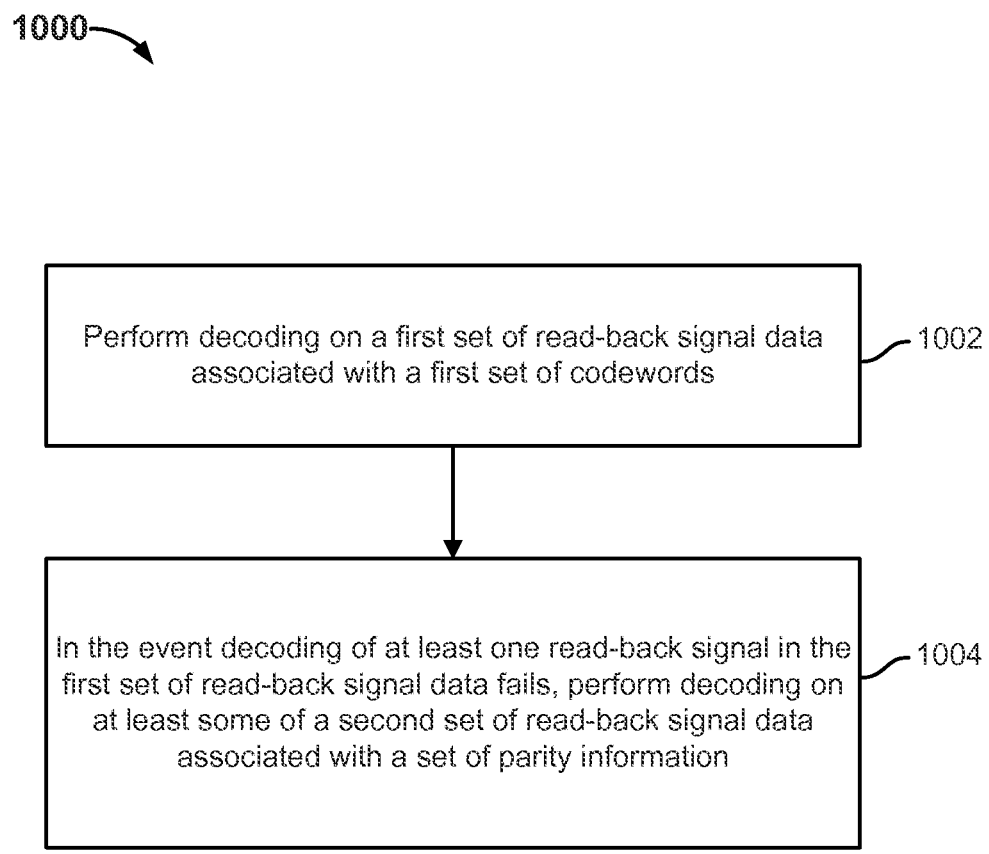
FIG. 10 is a flow diagram showing an embodiment of a process for decoding read-back signals.

FIG. 10 is a flow diagram showing an embodiment of a process for decoding read-back signals. In one example, information is stored in a shingled magnetic recording system, and the process may be triggered when information stored on the shingled magnetic recording system is desired (e.g., the stored information is a word processing file and a word processing application is instructed by a user to open that file).

At 1002, decoding on a first set of read-back signal data associated with a first set of codewords is performed. In some embodiments, step 1002 is performed each time stored data is desired and is part of a "normal" read process or decoding process. At least a portion of the data associated with a first set of codewords written to a medium (e.g., hard disk) is read. The data read comprises the first set of read-back signal data, which is to be decoded to recover the first set of codewords and the user data from which the first set of codewords is generated. The first set of read-back signal data is decoded using a first code.

At 1004, in the event decoding of at least one read-back signal in the first set of read-back signal data fails, decoding on at least some of a second set of read-back signal data associated with a set of parity information is performed. In some embodiments, step 1004 is associated with a recovery mode or recovery process. Typically, a normal read process or normal decoding process is sufficient to properly recovery the original data. However, in some cases the amount of noise in the read-back signal is relatively high and a recovery process is employed (e.g., using additional redundant information which was not necessarily used in the normal read or decoding process). In some embodiments, read-back signals in a first set of read-back signal data are decoded sequentially. The codewords successfully decoded from the first set of read-back signals associated with the first set of codewords are output. However, if at least one of the read-back signals associated with the first set of codewords is not successfully decoded, then further processing using a second set of read-back signal data associated with a set of parity information is needed to correctly decode the uncorrectable read-back signals associated with the first set of codewords.

As will be described further below, in various embodiments of Scheme 1, the set of parity information is associated with parity information generated from at least a portion of the first set of codewords using a second systematic code. A corresponding decoding process may perform corresponding processes in the reverse order.

As will be described further below, in various embodiments of Scheme 2, the set of parity information is generated as follows: at least a portion of the first set of codewords is encoded using a systematic code into a second set of codewords and then groups of the parity information of the second set of codewords are encoded using another systematic code into a third set of codewords. The parity portion of the third set of codewords comprises the set of parity information to be used to decode the uncorrectable read-back signals associated with the first set of codewords. A corresponding decoding process may perform corresponding processes in the reverse order. In some cases, some information required by a decoder during a recovery mode is not available (e.g., because to save space it was not stored on the storage media) and that information is synthesized, reconstituted, or estimated.

Below are some examples of decoding data encoded using Scheme 1 and Scheme 2:

For Scheme 1, the read-back signals associated with m codewords in $C_1$ are decoded sequentially. However, if a read-back signal associated with $C_1$ codeword fails to decode successfully, the $C_2$ parity will contain errors. After the read-back signals of m $C_1$ codewords are processed, either error-free $C_2$ parity or $C_2$ parity that contains errors is obtained, depending on whether all read-back signals associated with $C_1$ codewords are successfully decoded. If all read-back signals associated with m $C_1$ codewords are decoded successfully, the decoding results are output without further processing (i.e., the user data is successfully recovered from successfully decoding all $C_1$ codewords). On the other hand, if any of the read-back signals associated with the m $C_1$ codewords have failed to decode successfully, the stored $C_2$ parity information is read. The read-back signals associated with the $C_2$ codewords are used to redecode the uncorrectable $C_1$ codewords.

Figure 11:
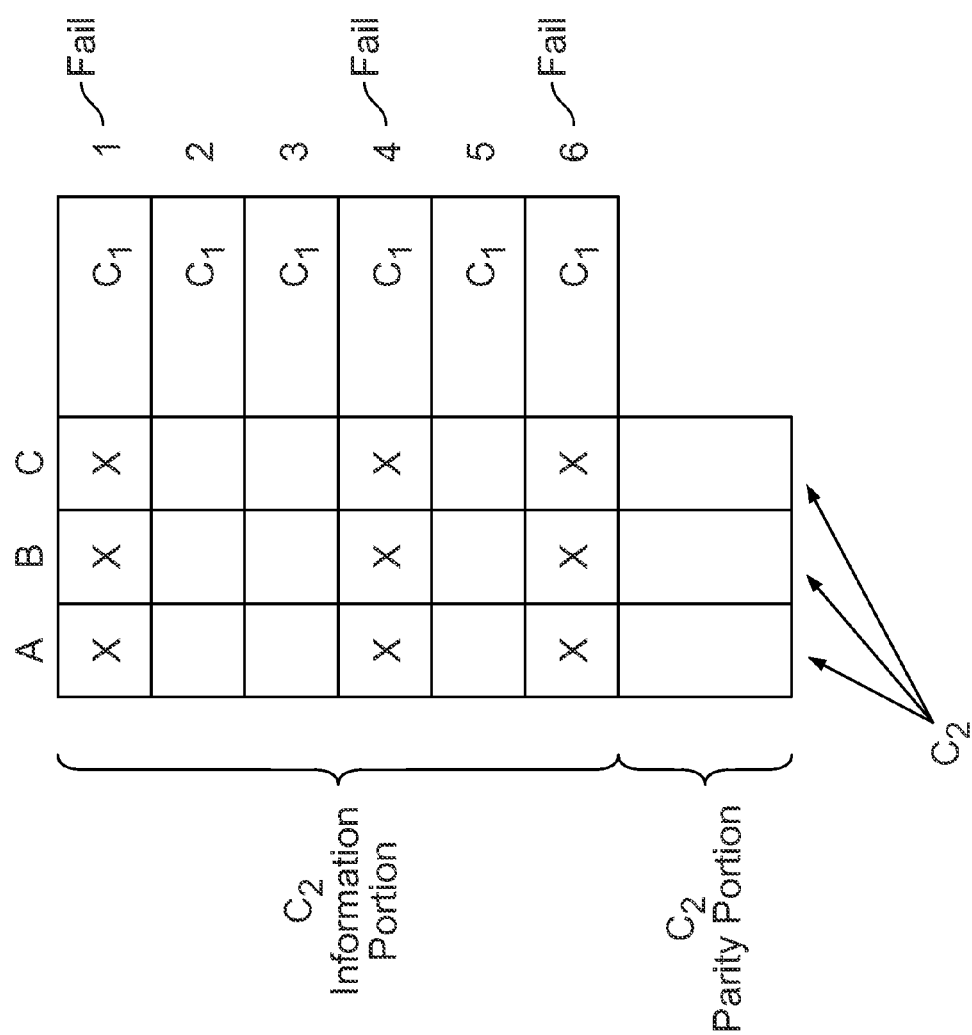
FIG. 11 is a diagram showing an example of decoding data encoded using Scheme 1.

Below is an example of a formal definition of the Scheme 1 decoding technique:

for i=0 to m−1 decode the read-back signal associated with $C_1$ codeword i if decoding successful output $C_1$ codeword i else store read-back signal associated with $C_1$ codeword i for further processing end end if all read-back signals associated with m $C_1$ codewords successfully decoded terminate algorithm else read the stored $C_2$ codewords use the read-back signals associated with the $C_2$ codewords to decode the uncorrectable $C_1$ codewords end if FIG. 11 is a diagram showing an example of decoding data encoded using Scheme 1. In the example, the $C_1$ codewords are shown as rows and the $C_2$ codewords are shown as columns. In the columns of $C_2$ codewords, the portion of each column that includes $C_1$ information is the systematic information portion of the $C_2$ codewords and the portion of each column that lies below the $C_1$ codewords is the parity portion of the $C_2$ codewords. As shown in the example, the $C_1$ codewords in rows 1, 4, and 6 did not decode correctly (e.g., because there was too much noise in those sectors) and are shown shaded and labeled with "Fail." The remaining $C_1$ codewords (in rows 2, 3, and 5) are correctly decoded. To further process the uncorrectable $C_1$ codewords in rows 1, 4, and 6, the stored $C_2$ codewords of columns A, B, and C may be read and used. In some embodiments, the read-back signals associated with the $C_2$ codewords of columns A, B, and C may be input into a decoder, as described in FIG. 12 below. In some embodiments, by successfully decoding at least some of the stored $C_2$ codewords of columns A, B, and C, the uncorrectable $C_1$ codewords (in rows 1, 4, and 6) may be recovered using the decoding results of the $C_2$ codewords.

Figure 12:
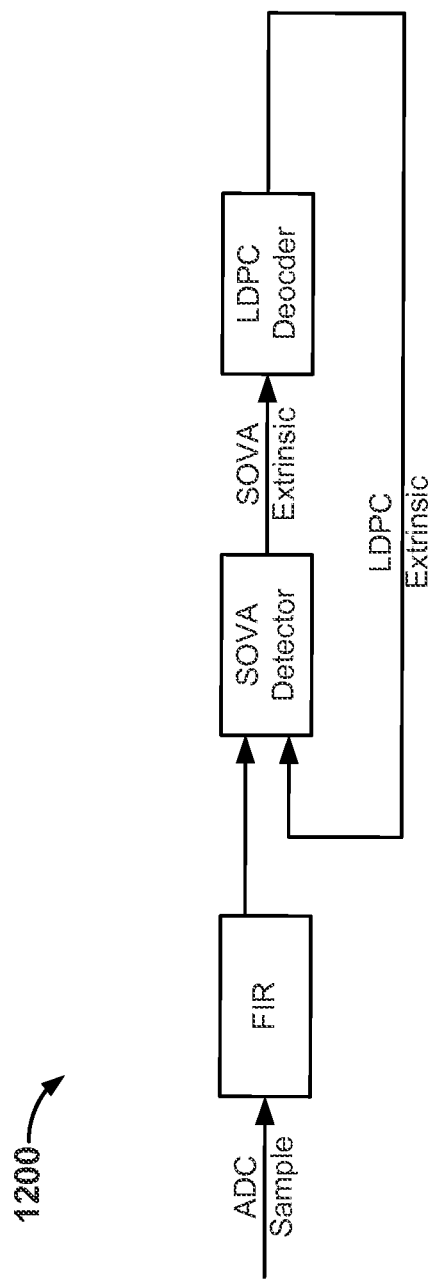
FIG. 12 is a diagram showing an example of a decoder.

FIG. 12 is a diagram showing an example of a decoder. Decoder 1200 includes a finite impulse filter (FIR), a soft-output Viterbi detector (SOVA detector), and a low-density parity check (LDPC) decoder. The analog-to-digital (ADC) samples (e.g., processed from read-back signals) are first processed by the FIR. The output of the FIR is input into the SOVA detector, which outputs extrinsic information that is in turn input to the LDPC decoder. The LDPC decoder generates its own extrinsic information which is then fed back to the SOVA detector. The decoding rounds are repeated iteratively until the codeword is corrected or no further progress can be made. Decoder 1200 may be used to decode the $C_2$ codewords of columns A, B, and C in the example of FIG. 11.

Returning to the example of decoding data encoded using Scheme 1 as illustrated in FIG. 11, further processing of the uncorrectable $C_1$ codewords may include feeding the read-back signals associated with the $C_2$ codewords of columns A, B, and C into a decoder such as decoder 1200. The successfully decoded $C_2$ codewords of columns A, B, and C may be used to correct the potential or possible locations of the errors which resulted in uncorrectable $C_1$ codewords. These potential or possible locations of errors include column A, row 1; column B, row 1; column C, row 1; column A, row 4; column B, row 4; column C, row 4; column A, row 6; column B, row 6; and column C, row 6.

For Scheme 2, as the read-back signals associated with m codewords in $C_1$ are decoded sequentially, in parallel, one or more systematic encoders for $C_2$ operate to generate the $n_1(n_2-m)$-tuple parity. However, if a read-back signal associated with $C_1$ codeword fails to decode successfully, the $C_2$ parity will contain errors. After read-back signals associated with m $C_1$ codewords are processed, either error-free $C_2$ parity or $C_2$ parity that contains errors is obtained, depending on whether all read-back signals associated with $C_1$ codewords are successfully decoded. If all read-back signals associated with m $C_1$ codewords are decoded successfully, the decoding results are output without further processing (i.e., the user data is successfully recovered from successfully decoding all $C_1$ codewords). On the other hand, if any of the read-back signals associated with m $C_1$ codewords failed to decode (e.g., because there was too much noise in those sectors), the last $$\frac{(n_3-k_3)}{n_1}\left\lceil\frac{n_1(n_2-m)}{k_3}\right\rceil$$

interleaves that contain the parity data of $C_3$ are read. The read-back signals associated with these parity bits, along with the generated $C_2$ parity bits, are used to redecode the uncorrectable $C_1$ codewords.

Below is an example of a formal definition of the Scheme 2 decoding technique:
Initialize:
    reset systematic encoder(s) for $C_2$
for i=0 to m−1
    decode the read-back signal associated with $C_1$ codeword i in $C_1$
    if decoding successful
        update encoders for $C_2$ based on the newly decoded $C_1$ codeword i
        output $C_1$ codeword i
    else
        store the read-back signal associated with $C_1$ codeword i for further processing
    end
end
if all the read-back signals associated with m $C_1$ codewords are successfully decoded
    terminate algorithm
else
    Read the $$\frac{(n_3-k_3)}{n_1}\left\lceil\frac{n_1(n_2-m)}{k_3}\right\rceil$$

sectors containing the $C_3$ parity information
    Use method T to decode the read-back signals associated with in $C_3$ and use the results of decoding to decode the uncorrectable $C_1$ codewords.
end if As mentioned above in the example of the formal definition of Scheme 2, only the uncorrectable $C_1$ codewords are stored in memory and the correctly decoded $C_1$ codewords are not stored in memory but are output (e.g., during the recovery mode or process). Because potentially less than all of the results of the decoded $C_1$ codewords (i.e., only the uncorrectable $C_1$ codewords) are stored in memory, memory usage (e.g., temporary "scratch space" as opposed to more long-term storage) is minimized.

As mentioned above in the example of the formal definition of Scheme 2, in the event that at least one of the read-back signals associated with the first set of codewords ($C_1$) is uncorrectable, further processing is performed using the stored $C_3$ parity information. In various embodiments, this technique of further processing is referred to as "method T."

Figure 13:
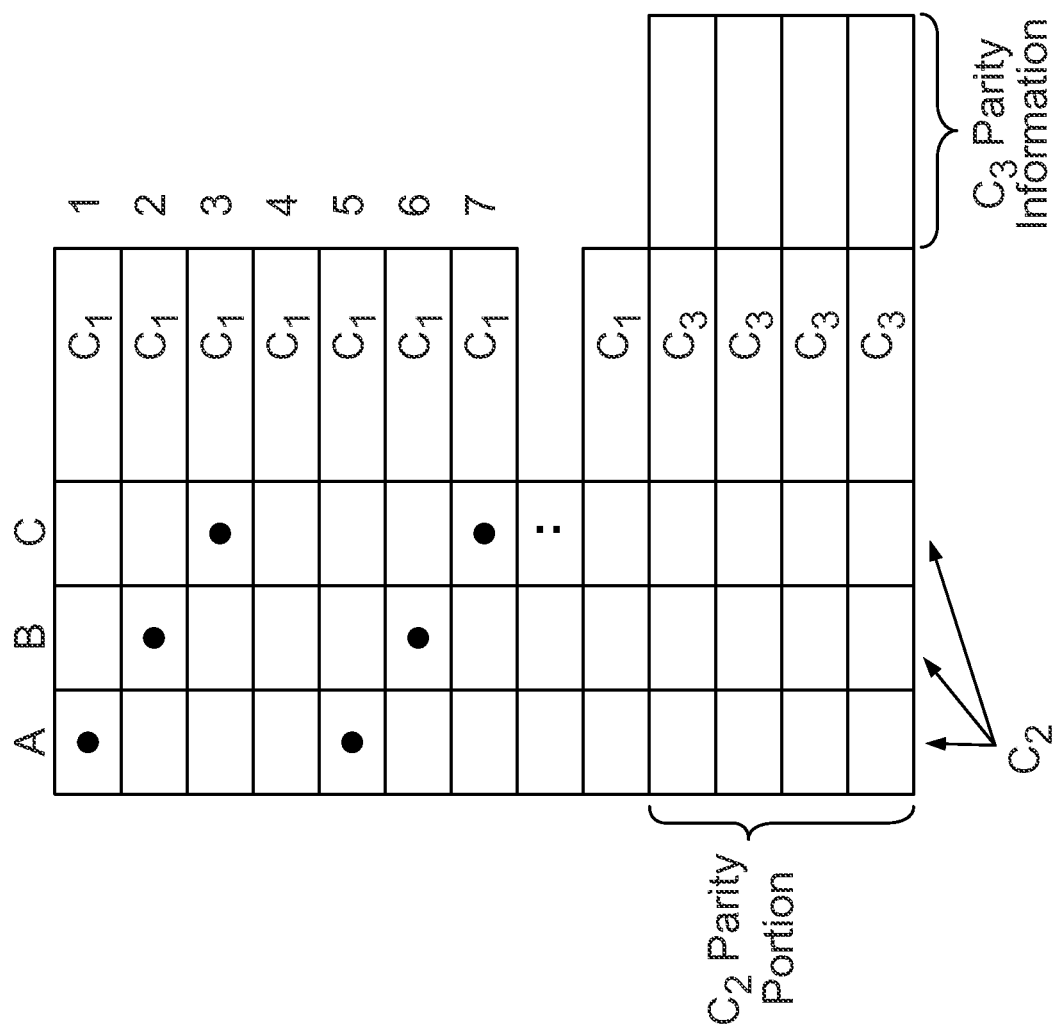
FIG. 13 is a diagram showing an embodiment of encoded data using Scheme 2 in which $C_2$ comprises the parity check matrix $H_2$ as shown above.
Figure 14:
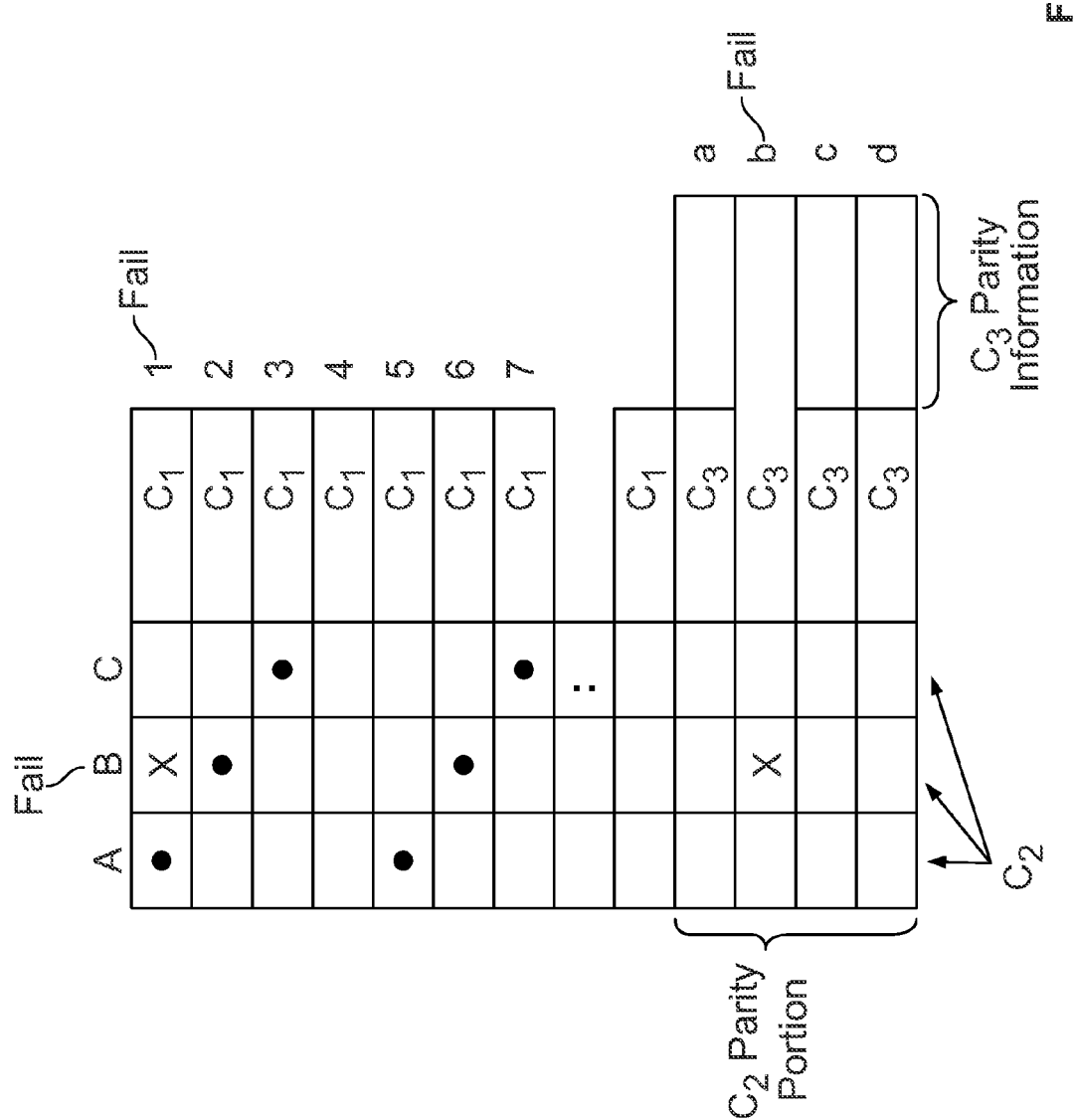
FIG. 14 is a diagram showing an embodiment of decoding the data encoded using Scheme 2 and in which $C_2$ comprises the parity check matrix $H_2$ as shown above.

For decoding read-back signals associated with Scheme 2, before formally defining method T, FIGS. 13 and 14 help illustrate an example of applying method T to a relatively simple case of decoding the set of read-back signals associated with the first set of codewords ($C_1$) in which only one read-back signal associated with the first set of codewords ($C_1$) is uncorrectable:

Let $C_2$ be the parity check matrix $H_2$ defined as:

$$H_2 = \begin{bmatrix} 1 & 0 & 0 & 0 & 1 & 0 & 0 & 0 & \dots \\ 0 & 1 & 0 & 0 & 0 & 1 & 0 & 0 & \dots \\ 0 & 0 & 1 & 0 & 0 & 0 & 1 & 0 & \dots \\ 0 & 0 & 0 & 1 & 0 & 0 & 0 & 1 & \dots \end{bmatrix}$$

FIG. 13 is a diagram showing an embodiment of encoded data using Scheme 2 in which $C_2$ comprises the parity check matrix $H_2$ as shown above. In other words, in this simplified example, $C_2$ simply takes the parity of one of every other four $C_1$ codewords and in doing so, generates four more $C_2$ parity rows. Referring to the example, the $C_2$ parity information in column A is generated using the corresponding values from the $C_1$ codewords of rows 1 and 5. Likewise, the $C_2$ parity information in column B is generated using the corresponding values from the $C_1$ codewords of rows 2 and 6 and the $C_2$ parity information in column C is generated using the corresponding values from the $C_1$ codewords of rows 3 and 7. Also, as shown in the example, each $C_1$ codeword participates in only one set of $C_2$ parity information.

For a particular $C_2$ parity row, if only one of the $C_1$ codewords that participate in it is uncorrectable, the corresponding $C_2$ parity row can be decoded and the result can be back substituted to correct the uncorrectable $C_1$ codeword. For example, if the $C_1$ codeword in row 2 is not able to be decoded properly, the $C_2$ codeword stored in column B may be decoded to correct the bit stored at row 2, column B.

FIG. 14 is a diagram showing an embodiment of decoding the data encoded using Scheme 2 and in which $C_2$ comprises the parity check matrix $H_2$ as shown above. In the example, after decoding the $C_1$ codewords, only one $C_1$ codeword (the $C_1$ codeword in row 1) is determined to be uncorrectable. Based on the formal definition of the Scheme 2 decoding technique as described above, as $C_1$ codewords are being decoded, one or more $C_2$ encoders are running in parallel and receiving the decoded $C_1$ codewords. Given that the $C_1$ codeword in row 1 is the only one that is uncorrectable, the generated $C_2$ parity information that is affected by the uncorrectable $C_1$ codeword in row 1 is the $C_2$ parity information in column A. The $C_2$ parity information in column A is able to identify that the error of the $C_1$ codeword in row 1 is propagated to row b of the $C_3$ codewords. Then, stored $C_3$ parity information at row b can be read from storage to use to decode the $C_3$ codeword at row b. For example, the stored $C_3$ parity information at row b can be used with the relevant generated $C_2$ parity information that forms the $C_3$ systematic information at row b to decode the $C_3$ codeword at row b. Once the $C_3$ codeword at row b is successfully decoded, then the correct values of the $C_3$ codeword at row b can be used to determine which column in which the error at the $C_1$ codeword in row 1 is located. In this example, the column identified by the correctly decoded $C_3$ codeword to include error is column B. Subsequently, it is determined that the value at the intersection of the $C_1$ codeword in row 1 and column B is the error. So, the $C_1$ codeword in row 1 can be correctly decoded by first changing its value at the column B location and then iteratively performing decoding on the $C_1$ codeword in row 1 until it can be correctly decoded.

However, decoding data encoded using Scheme 2 is not as straight forward when multiple $C_1$ codewords belonging to the same parity row are uncorrectable.

Figure 15:
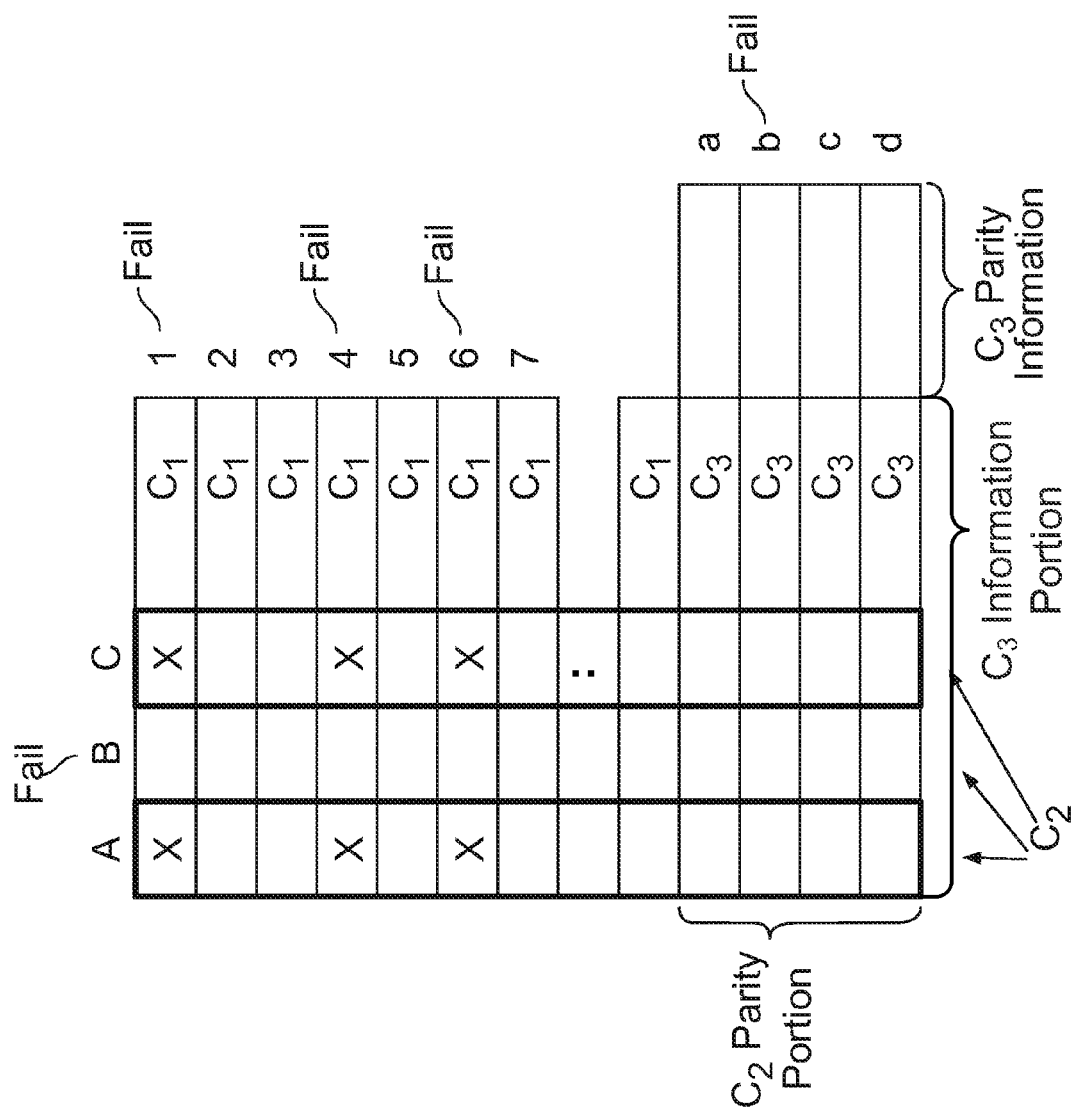
FIG. 15 is a diagram showing an embodiment of decoding data encoded using Scheme 2 and where more than one $C_1$ codeword is uncorrectable.

FIG. 15 is a diagram showing an embodiment of decoding data encoded using Scheme 2 and where more than one $C_1$ codeword is uncorrectable. As shown in the example, $C_1$ codewords in rows 1, 4, and 6 are uncorrectable. Due to the occurrence of multiple $C_1$ codewords being uncorrectable, it is no longer possible to narrow down the locations of the errors (i.e., the subset of columns that includes errors) within the uncorrectable $C_1$ codewords. For example, even if by using the stored $C_3$ parity information, it can be determined that columns A and C include error, it is not readily apparent which of $C_1$ codewords in rows 1, 4, and 6 include error at their respective column A and C values. In the descriptions below, the $C_1$ codewords and $C_2$ codewords will be referred to as rows (as shown in FIG. 15) and the corresponding values across multiple $C_1$ codewords will be referred to as columns (as shown in FIG. 15).

To eventually correct multiple $C_1$ uncorrectable interleaves that participate in to the same $C_2$ parity row, decoding codewords belonging to $C_3$ is performed. However, read-back signals (e.g., ADC samples) for the information portion of the $C_3$ codewords are not available because the $C_3$ information portion was not stored and only the parity portion of the $C_3$ codewords was stored onto the medium. As a result, the decoding soft outputs of the information portion of the codeword in the $C_3$ codewords need to be reconstituted so that it could be used with the read-back signals associated with the $C_3$ parity information stored on the medium to be input into a decoder to decode the $C_3$ codewords.

The following is an example of reconstituting the extrinsic information associated with the $C_3$ codewords to be fed into the LDPC decode in method T:

Let the following be the resulting log-likelihood ratio (LLR) from decoding the $i^{th}$ $C_1$ codeword:

$$c_i^1 = \{c_{i,0}^1, c_{i,1}^1, \ldots, c_{i,n_1-1}^1\}, i=0, \ldots, m-1$$

Let the following be the a priori input to the LDPC decoder for the $i^{th}$ $C_3$ codeword:

$$b_i^3 = \{b_{i,0}^3 b_{i,1}^3, \ldots, b_{i,n_3-1}^3\}, i=m, \ldots, n_2-m-1$$

While the parity information of the a priori input (b) into the LDPC decoder for the $i^{th}$ $C_3$ codeword may be generated by using the SOVA detector to process $C_3$ parity information read from storage, the information portion of the a priori input ($b_i^3$) needs to be reconstituted because the $C_3$ information portion is not stored. Let the information portion of the a priori input ($b_i^3$) into the LDPC decoder for the $i^{th}$ $C_3$ codeword be:

$$\{b_{i,0}^3, \ldots, b_{i,1}^3, \ldots, b_{i,n_3-1}^3\}, i=m, \ldots, n_2-m-1$$

Be reconstituted by:

$$b_{i,j}^3 = (\Pi_{\forall c_{k,j} \text{ participating in parity } i} \text{ sgn}(c_{k,j}^1)) (\min_{\forall c_{k,j} \text{ participating in parity } i} |c_{k,j}^1|) \quad (1)$$

where i represents the $i^{th}$ $C_3$ codeword, j represents the $j^{th}$ column, $(\Pi_{\forall c_{k,j} \text{participating in parity } i} \text{ sgn}(c_{k,j}^1))$ represents the products of all the signs of the $C_1$ LLRs within the $j^{th}$ column that participate in the $C_2$ parity, and $(\min_{\forall c_{k,j} \text{ participating in parity } i} |c_{k,j}^1|)$ represents the minimum of the absolute value among all the $C_1$ LLRs in the $j^{th}$ column that participate in the $C_2$ parity. In some embodiments, the products of all the signs of the $C_1$ LLRs within the $j^{th}$ column $(\Pi_{\forall c_{k,j} \text{participating in parity } i} \text{ sgn}(c_{k,j}^1))$ and the minimum of the absolute value among all the $C_1$ LLRs in the $j^{th}$ column $(\min_{\forall c_{k,j} \text{ participating in parity } i} |c_{k,j}^1|)$ were stored to the medium when encoded information was written to the medium and so such values may be read from storage. Referring to the example of FIG. 15, the $C_1$ codewords refer to rows 1 through 7, the $C_3$ codewords refer to rows a through d, and the columns refer to columns A, B, and C.

The $C_3$ parity information read from storage and the reconstituted information portion of the $C_3$ codewords ($b_{i,j}^3$) are then fed into a modified decoder for processing $C_3$ codewords.

Figure 16A:
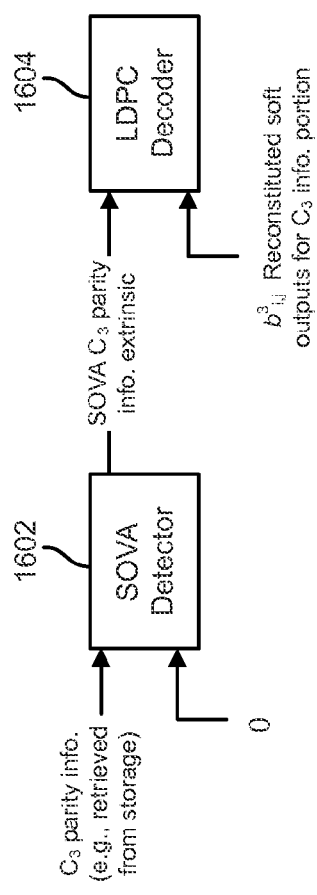
FIG. 16A illustrates an example of a modified decoder for processing $C_3$ codewords to be used in the first round of processing.
Figure 16B:
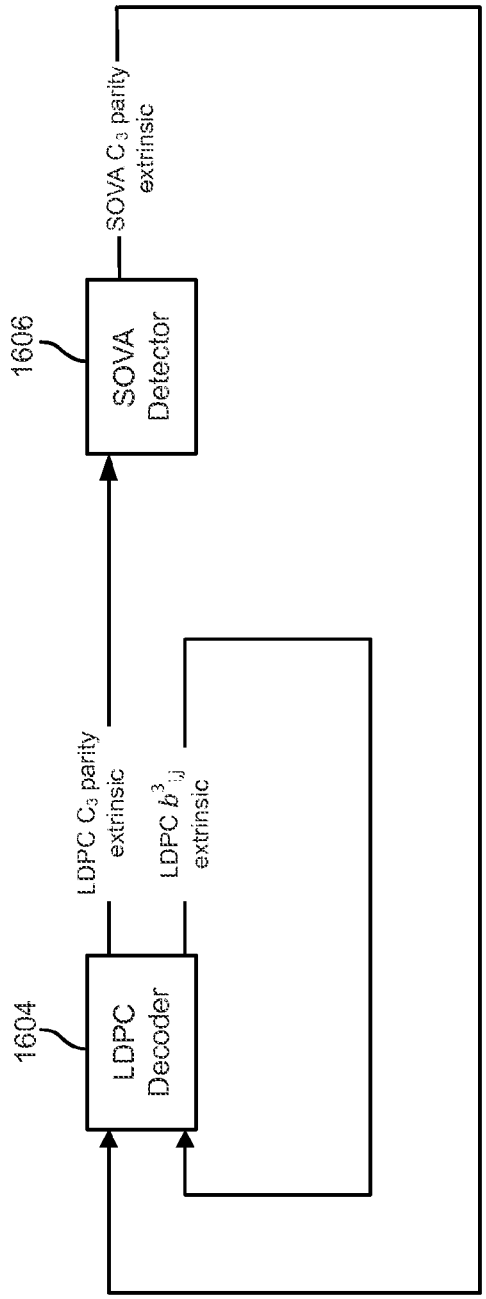
FIG. 16B illustrates an example of a modified decoder for processing $C_3$ codewords to be used in subsequent round(s) (i.e., a round subsequent to the first round) of processing.

FIGS. 16A and 16B are diagrams showing examples of a modified decoder for processing $C_3$ codewords. FIG. 16A illustrates an example of a modified decoder for processing $C_3$ codewords to be used in the first round of processing. Due to the characteristics of the SOVA detector, the SOVA detector is unable to process reconstituted information such as the reconstituted information portion of the $C_3$ codewords (M) and if the reconstituted information were fed into the SOVA detector, then the SOVA detector would yield bad results. However, as shown in the example, the LDPC decoder is capable of processing the reconstituted information (non-parity) portion of the $C_3$ codewords ($b_{i,j}^3$). As such, in the first round of SOVA detection and LDPC decoding, only the read-back signals of the $C_3$ parity information for a particular $C_3$ codeword, which is retrieved from storage, are input into SOVA detector 1602. Then the SOVA detector outputs $C_3$ parity extrinsic information based on the input read-back signals of the $C_3$ parity information for a particular $C_3$ codeword, which is input into LDPC decoder 1604, along with the reconstituted information portion of the $C_3$ codewords ($b_{i,j}^3$) for that particular $C_3$ codeword. Unlike the SOVA detector (e.g., such as SOVA detector 1602), the LDPC decoder (e.g., such as LDPC decoder 1604) is able to receive reconstituted information such as $b_{i,j}^3$. Therefore, as shown in FIG. 16A, reconstituted information $b_{i,j}^3$ is only fed into the LDPC decoder and bypasses the SOVA detector.

FIG. 16B illustrates an example of a modified decoder for processing $C_3$ codewords to be used in subsequent round(s) (i.e., a round subsequent to the first round) of processing. After the first round of processing, LDPC decoder 1604 outputs LDPC $C_3$ parity extrinsic information, which is fed into SOVA detector 1606, and LDPC $b_{i,j}^3$ non-parity information, which bypasses SOVA detector 1606, is fed back into LDPC decoder 1604. In some embodiments, SOVA detector 1606 comprises the same detector as SOVA detector 1602 and in some embodiments, SOVA detector 1606 comprises a separate detector from SOVA detector 1602. SOVA detector 1606 processes the input LDPC $C_3$ parity extrinsic information to generate SOVA $C_3$ parity extrinsic information, which is input back into LDPC decoder 1604. The iterative processing between LDPC decoder 1604 and SOVA detector 1606 continues until it is determined that the $C_3$ codeword is successfully decoded.

Once the $C_3$ codewords are successfully decoded, they can be used to indicate which columns include a bit in error and which do not by comparing $b_i^3$ with the decoding result of the particular $C_3$ codeword. Referring back to FIG. 15, after decoding one or more $C_3$ codewords of rows a through d, it can be determined that a bit in error is located at one or more $C_3$ codewords at locations of columns A and C. However, it is not yet known which of the uncorrectable $C_1$ codewords 1, 4, and 6 that the error bits of columns A and C belong to. Nevertheless, based on the known columns that include error bits, the a priori input to the LDPC decoder can be modified for the uncorrectable $C_1$ codewords to attempt to decode the uncorrectable $C_1$ codewords again.

The following is an example of reprocessing the uncorrectable $C_1$ codewords:

Let the following be the a priori input to the LDPC decoder for the uncorrectable $C_1$ codeword is i:

$$b_i^1 = \{b_{i,0}^1, b_{i,1}^1, \ldots, b_{i,n_1-1}^1\}, i = 0, \ldots, m-1$$

Let $\hat{b}_{i,j}^1$ be the portion of $b_i^1$ belonging to column j that includes an error bit as indicated after decoding the $C_3$ codewords and let $b_{i,j}^1$ be the portion of $b_i^1$ belonging to column j that does not include an error bit as indicated after decoding the $C_3$ codewords. $\hat{b}_{i,j}^1$ and $b_{i,j}^1$ can be modified in many ways. In one example, $\hat{b}_{i,j}^1$ may be set to 0, which in essence erases this error location. However, the examples of $\hat{b}_{i,j}^1$ and $b_{i,j}^1$ to be used in reprocessing an $i^{th}$ uncorrectable $C_1$ codeword are as follows:

For uncorrectable $C_1$ codeword i, for bits belonging to a column that does not indicate an error bit:

$$b_{i,j}^1 = \begin{cases} \infty & \text{if } c_{i,j}^1 \geq 0 \\ -\infty & \text{otherwise} \end{cases} \quad (2)$$

In practice, $\infty$ and $-\infty$ of equation (2) may be substituted by some maximum positive and negative values.

Referring back to FIG. 15, if the $C_1$ codeword in row 1 were to be reprocessed, $b_{i,j}^1$ would be used to determine the values for location column B, row 1 because column B is not indicated to include an error bit.

For uncorrectable $C_1$ codeword i, for bits belonging to a column that does indicate an error bit:

$$\hat{b}_{i,j}^1 = (\Pi_{\forall k \neq i \text{ participating in same parity}} \text{sgn}(\hat{b}_{k,j}^1)) (\min_{\forall k \neq i \text{ participating in same parity}} |\hat{b}_{k,j}^1|) \quad (3)$$

Where i represents the uncorrectable $C_1$ codeword i, j represents the $j^{th}$ column, $(\Pi_{\forall k \neq i \text{ participating in same parity}} \text{sgn}(\hat{b}_{k,j}^1))$ represents the product of all the signs of all the values at the $j^{th}$ column of $C_1$ codewords that participate in the $C_2$ parity other than $C_1$ codeword i, and $(\min_{\forall k \neq i \text{ participating in same parity}} |\hat{b}_{k,j}^1|)$ represents the minimum of the absolute value among all the values at the $j^{th}$ column of $C_1$ codewords that participate in the $C_2$ parity other than $C_1$ codeword i. In some embodiments, the product of all the signs of all the values of $C_1$ codeword i $(\Pi_{\forall k \neq i \text{ participating in same parity}} \text{sgn}(\hat{b}_{k,j}^1))$ was stored to the medium when encoded information was written to the medium and so this product of the signs may be read from storage. In some embodiments, the minimum of the absolute value of all the values in a column j and its respective location ($C_1$ codeword row) as well as the next minimum of the absolute value of all the values in a column j and its respective location ($C_1$ codeword row) were stored to the medium when encoded information was written to the medium and so such information may be read from storage to use for $(\min_{\forall k \neq i \text{ participating in same parity}} |\hat{b}_{k,j}^1|)$.

Referring back to FIG. 15, if the $C_1$ codeword in row 1 were to be reprocessed, $\hat{b}_{i,j}^1$ would be used to determine the values for locations column A, row 1 and column C, row 1. To determine $\hat{b}_{i,A}^1$ for example, $(\min_{\forall k \neq i \text{ participating in same parity}} |\hat{b}_{k,A}^1|)$ would be the minimum of the absolute value from among the values at locations column A, row 2; column A, row 3; column A, row 4; column A, row 5; column A, row 6; and column A, row 7. And to determine $\hat{b}_{4,A}^1$ for example, $(\min_{\forall k \neq i \text{ participating in same parity}} |\hat{b}_{k,A}^1|)$ would be the minimum of the absolute value from among the values at locations column A, row 1; column A, row 2; column A, row 3; column A, row 5; column A, row 6; and column A, row 7.

The determined $b_i^1$ (comprising $\hat{b}_{i,j}^1$ and $b_{i,j}^1$) are then fed into a modified decoder for processing uncorrectable $C_1$ codewords.

Figure 17A:
FIG. 17A illustrates an example of a modified decoder for reprocessing uncorrectable $C_1$ codewords to be used in the first round of processing.
Figure 17B:
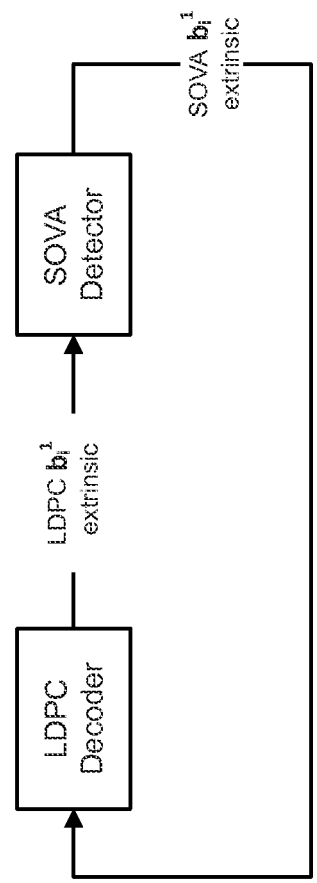
FIG. 17B illustrates an example of a modified decoder for reprocessing uncorrectable $C_1$ codewords to be used in subsequent round(s) (i.e., a round subsequent to the first round) of reprocessing.

FIGS. 17A and 17B are diagrams showing examples of a modified decoder for reprocessing uncorrectable $C_1$ codewords. FIG. 17A illustrates an example of a modified decoder for reprocessing uncorrectable $C_1$ codewords to be used in the first round of processing. Note that in this example, information ($b_i^1$) is first input into the LDPC decoder. The output LDPC $b_i^1$ extrinsic information is input into the SOVA detector.

FIG. 17B illustrates an example of a modified decoder for reprocessing uncorrectable $C_1$ codewords to be used in subsequent round(s) (i.e., a round subsequent to the first round) of reprocessing. After the first round of reprocessing, the SOVA detector outputs SOVA $b_i^1$ extrinsic information, which is input into the LDPC decoder. The iterative processing between the LDPC decoder and the SOVA detector continues until it is determined that the $C_1$ codeword i is successfully decoded.

In some embodiments, if the reprocessing of $C_1$ codeword i is unsuccessful, then the newly generated LDPC extrinsic information in $C_1$ is used to decode the $C_3$ codewords and the result of decoding $C_3$ codewords may be used to reprocess $C_1$ codeword i again. This process of reprocessing $C_1$ codeword i and $C_3$ codewords may be repeated one or more times until $C_1$ codeword i is successfully decoded.

The following is an example of a formal definition of method T for reprocessing one or more $C_1$ codewords encoded using Scheme 2 that are determined to be uncorrectable during decoding:
while uncorrectable $C_1$ codeword(s) exist(s) or maximum iteration has not been reached
    reconstitute the information portion of the $C_3$ codewords
    decode the $C_3$ codewords using the reconstituted information portion
    if none of the $C_3$ codewords can be successfully decoded terminate algorithm
    else
    modify the a priori input $b_i^1$ for the uncorrectable $C_1$ codeword(s) using equations (2) and (3)
    redecode the uncorrectable $C_1$ codeword(s) using the modified decoder for reprocessing $C_1$
    end
end Example Simulation Results for Scheme 2

For a simulation of Scheme 2, a concatenated code C with 100 interleaves (m=100) was constructed. $C_1$ is a length 40000, rate 0.9 code, $C_1$={40000,36000}. $C_2$ is a simple parity check code, $C_2$=101,100, with parity check matrix $H_2$ consisting of a row of 101 ones. $C_3$ is a rate 0.5 code, $C_3$={80000,40000}. It is assumed that ITI can affect any 3 of the 100 interleaves. The 3 ITI affected sectors experiences a SNR that is uniformly worse than the other sectors by a constant. For example, if the SNR degradation constant is 3 dB, and if normal sectors experience a SNR of 10 dB, then the ITI affected sectors have an SNR of 7 dB.

Figure 18:
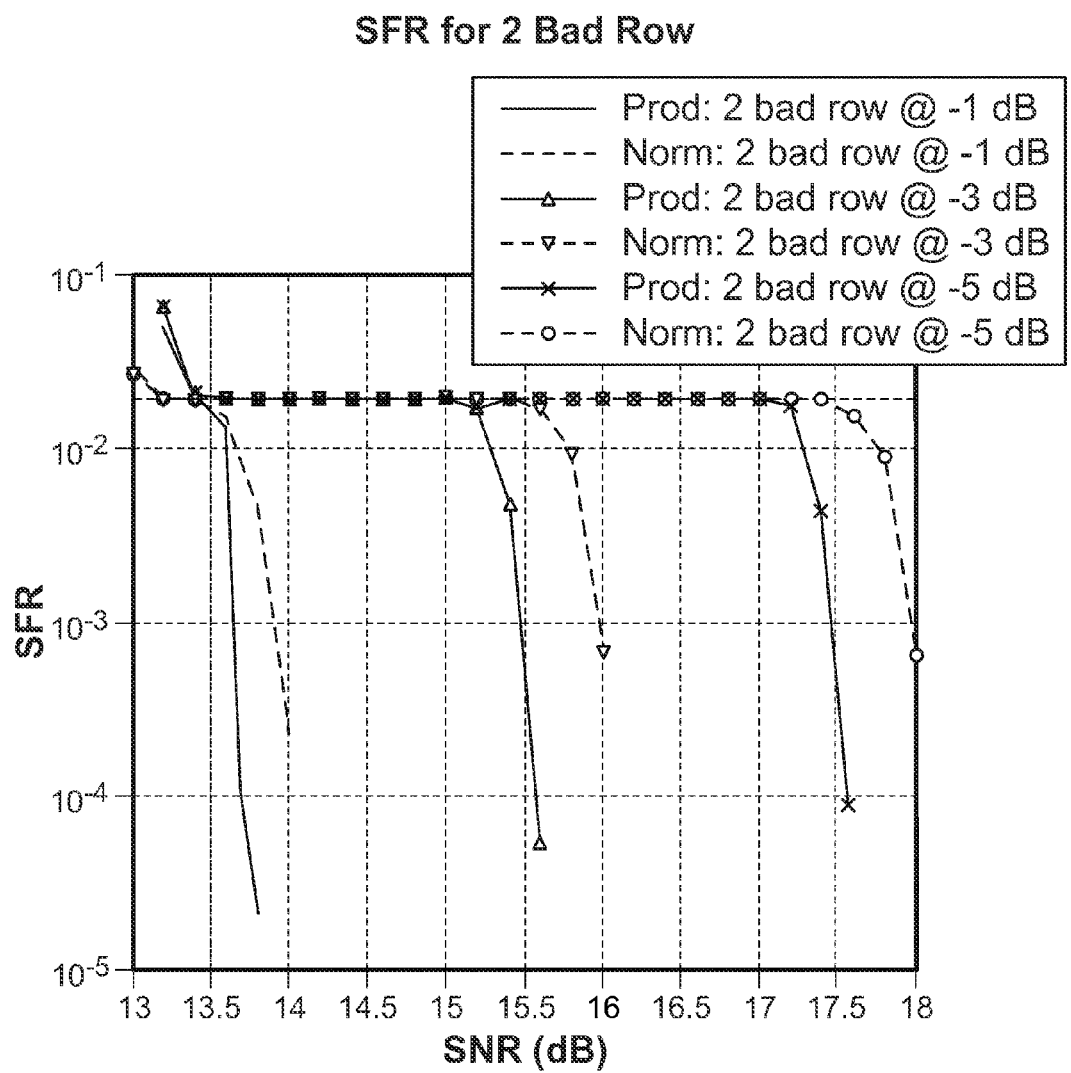
FIG. 18 is a diagram showing the results of the simulation using the above described concatenated code C of Scheme 2.

FIG. 18 is a diagram showing the results of the simulation using the above described concatenated code C of Scheme 2. The dashed curves (associated with the labels of "Norm") are the performance on ITI channel without using concatenated code. The solid curves (associated with the labels of "Prod") are the performance using concatenated code with the described concatenated code C of Scheme 2. Three different SNR degradation conditions were simulated.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for encoding, comprising:
one or more processors configured to:
    encode user data into a first set of codewords using a first code;
    generate a first set of parity information based at least in part on encoding the first set of codewords using at least a second code; and
    write the first set of codewords and at least parity information associated with the first set of parity information to shingled magnetic recording storage; and
one or more memories coupled to the one or more processors and configured to provide the one or more processors with instructions.

2. The system of claim 1, wherein the second code comprises a systematic code.

3. The system of claim 1, wherein the at least parity information written comprises the first set of parity information.

4. The system of claim 1, wherein the one or more processors are further configured to generate a second set of parity information based at least in part on the first set of parity information and at least a third code.

5. The system of claim 4, wherein the at least parity information written comprises the second set of parity information.

6. The system of claim 4, wherein the third code comprises a systematic code.

7. The system of claim 4, wherein the first set of parity information is grouped into one or more groups and wherein the second set of parity information is generated using the third code based on the one or more groups of the first set of parity information.

8. A method for encoding, comprising:
encoding user data into a first set of codewords using a first code;
generating a first set of parity information based at least in part on the first set of codewords using at least a second code; and
writing the first set of codewords and at least parity information associated with the first set of parity information to shingled magnetic recording storage.

9. The method of claim 8, wherein the second code comprises a systematic code.

10. The method of claim 8, wherein the at least parity information written comprises the first set of parity information.

11. The method of claim 8, further comprising generating a second set of parity information based at least in part on the first set of parity information and at least a third code.

12. The method of claim 11, wherein the at least parity information written comprises the second set of parity information.

13. The method of claim 11, wherein the third code comprises a systematic code.

14. The method of claim 11, wherein the first set of parity information is grouped into one or more groups and wherein the second set of parity information is generated using the third code based on the one or more groups of the first set of parity information.

15. A computer program product being embodied in a tangible computer readable storage medium which, when executed by a computer, causes the computer to perform encoding instructions, comprising:
encoding user data into a first set of codewords using a first code;
generating a first set of parity information based at least in part on the first set of codewords using at least a second code; and
writing the first set of codewords and at least parity information associated with the first set of parity information to shingled magnetic recording storage.

16. A system for decoding, comprising:
one or more processors configured to:
    generate a first set of read-back signal data associated with a first set of codewords from shingled magnetic recording storage;
    perform decoding on the first set of read-back signal data; and
    in response to a failure to decode at least one read-back signal in the first set of read-back signal data:
        generate a second set of read-back signal data associated with a set of parity information; and
        perform decoding on at least some of the second set of read-back signal data; and
one or more memories coupled to the one or more processors and configured to provide the one or more processors with instructions.

17. The system of claim 16, wherein to perform decoding on the first set of read-back signals includes inputting the first set of read-back signals into a detector and a decoder.

18. The system of claim 16, wherein the one or more processors are further configured to output a successfully decoded one of the first set of read-back signals.

19. The system of claim 16, wherein the one or more processors are further configured to store a read-back signal of the first set of read-back signals that failed to decode correctly.

20. The system of claim 16, wherein the one or more processors are further configured to use decoding results from decoding the set of parity information to perform reprocessing on a read-back signal of the first set of read-back signals that failed to decode correctly.

21. The system of claim 16, wherein to perform decoding on at least some of the second set of read-back signal data associated with the set of parity information includes generating reconstituted information corresponding to the set of parity information.

22. The system of claim 21, wherein the one or more processors are configured to input the reconstituted information corresponding to the set of parity information to a decoder and to input the set of parity information to a detector.

23. The system of claim 21, wherein the reconstituted information corresponding to the set of parity information comprises:

$$b_{i,j}^3 = (\Pi_{\forall c_{k,j} \text{ participating in parity } i} \text{sgn}(c_{k,j}^1))(\min_{\forall c_{k,j} \text{ participating in parity } i} |c_{k,j}^1|)$$

where i represents the $i^{th}$ codeword in the set of parity information, and j represents the $j^{th}$ column corresponding to the first set of codewords.

24. The system of claim 16, wherein decoding results of the set of parity information are configured to determine columns that include error in a first codeword of the first set of codewords, wherein the first codeword is associated with a read-back signal that failed to decode correctly.

25. The system of claim 24, wherein the one or more processors are further configured to reprocess the first codeword including by using the decoding result of the set of parity information to generate reconstituted information associated with the first codeword.

26. The system of claim 25, wherein the one or more processors are further configured to input the reconstituted information associated with the first codeword into a decoder.

27. The system of claim 25, wherein the reconstituted information associated with the first codeword comprises $b_{i,j}^1$ for values belonging to columns that do not include error and $\hat{b}_{i,j}^1$ for values belonging to columns that do include error, wherein:

$$b_{i,j}^1 = \begin{cases} \infty & \text{if } c_{i,j}^1 \geq 0 \\ -\infty & \text{otherwise} \end{cases}$$

and $$\hat{b}_{i,j}^1 = \left(\prod_{\forall k \neq i \text{ participating in same parity}} sgn(\hat{b}_{k,j}^1)\right)\left(\min_{\forall k \neq i \text{ participating in same parity}} |\hat{b}_{k,j}^1|\right)$$

wherein i represents the uncorrectable codeword i in the first set of codewords, and j represents the $j^{th}$ column corresponding to the first set of codewords.

28. A method for decoding, comprising:
generating a first set of read-back signal data associated with a first set of codewords from shingled magnetic recording storage;
performing decoding on the first set of read-back signal data; and
in response to a failure to decode at least one read-back signal in the first set of read-back signal data:
generating a second set of read-back signal data associated with a set of parity information; and
performing decoding on at least some of the second set of read-back signal data.

29. The method of claim 28, wherein performing decoding on at least some of the second set of read-back signal data associated with the set of parity information includes generating reconstituted information corresponding to the set of parity information.

30. The method of claim 29, further comprising inputting the reconstituted information corresponding to the set of parity information to a decoder and inputting the set of parity information to a detector.

31. The method of claim 30, wherein the reconstituted information corresponding to the set of parity information comprises:

$$b_{i,j}^3 = (\Pi_{\forall k,j \text{ participating in same parity } i} \text{sgn}(c_{k,j}^1))(\min_{\forall c_{k,j} \text{ participating in parity } i} |c_{k,j}^1|)$$

where i represents the $i^{th}$ codeword in the set of parity information, and j represents the $j^{th}$ column corresponding to the first set of codewords.

32. The method of claim 28, wherein decoding results of the set of parity information includes determining columns that include error in a first codeword of the first set of codewords, wherein the first codeword is associated with a read-back signal that failed to decode correctly.

33. The method of claim 32, further comprising reprocessing the first codeword including by using the decoding result of the set of parity information to generate reconstituted information associated with the first codeword.

34. The method of claim 33, wherein the reconstituted information associated with the first codeword comprises $b_{i,j}^1$ for values belonging to columns that do not include error and $\hat{b}_{i,j}^1$ for values belonging to columns that do include error, wherein:

$$b_{i,j}^1 = \begin{cases} \infty & \text{if } c_{i,j}^1 \geq 0 \\ -\infty & \text{otherwise} \end{cases}$$

and $$\hat{b}_{i,j}^1 = \left(\prod_{\forall k \neq i \text{ participating in same parity}} sgn(\hat{b}_{k,j}^1)\right)\left(\min_{\forall k \neq i \text{ participating in same parity}} |\hat{b}_{k,j}^1|\right)$$

wherein i represents the uncorrectable codeword i in the first set of codewords, and j represents the $j^{th}$ column corresponding to the first set of codewords.

35. A computer program product being embodied in a tangible computer readable storage medium which, when executed by a computer, causes the computer to perform decoding instructions, comprising:
generating a first set of read-back signal data associated with a first set of codewords from shingled magnetic recording storage;

performing decoding on the first set of read-back signal data; and in response to a failure to decode at least one read-back signal in the first set of read-back signal data:
  generating a second set of read-back signal data associated with a set of parity information; and
  performing decoding on at least some of a second set of read-back signal data associated with a set of parity information.

* * * * *